(12) United States Patent
Uchida et al.

(10) Patent No.: US 12,080,747 B2
(45) Date of Patent: Sep. 3, 2024

(54) SOLID-STATE IMAGING APPARATUS, METHOD OF MANUFACTURING THE SAME, AND ELECTRONIC DEVICE

(71) Applicant: SONY SEMICONDUCTOR SOLUTIONS CORPORATION, Kanagawa (JP)

(72) Inventors: Hirohisa Uchida, Kanagawa (JP); Shinichiro Noudo, Kanagawa (JP); Tooru Idekoba, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 594 days.

(21) Appl. No.: 17/289,719

(22) PCT Filed: Nov. 1, 2019

(86) PCT No.: PCT/JP2019/043110
§ 371 (c)(1),
(2) Date: Apr. 28, 2021

(87) PCT Pub. No.: WO2020/095850
PCT Pub. Date: May 14, 2020

(65) Prior Publication Data
US 2022/0005851 A1    Jan. 6, 2022

(30) Foreign Application Priority Data
Nov. 9, 2018    (JP) ................................ 2018-211638

(51) Int. Cl.
*H01L 27/146* (2006.01)

(52) U.S. Cl.
CPC .... *H01L 27/1464* (2013.01); *H01L 27/14623* (2013.01); *H01L 27/14636* (2013.01);
(Continued)

(58) Field of Classification Search
CPC .......... H01L 27/1464; H01L 27/14623; H01L 27/14643; H01L 27/14689; H01L 27/1463;
(Continued)

(56) References Cited

U.S. PATENT DOCUMENTS 8,564,034 B2 * 10/2013 Masuoka .......... H01L 27/14616
250/214.1
2011/0233702 A1 * 9/2011 Takahashi ......... H01L 27/14638
257/E31.127
(Continued)

FOREIGN PATENT DOCUMENTS

CN    103403869 A    11/2013
CN    105405856 A    3/2016
(Continued)

OTHER PUBLICATIONS

International Search Report and Written Opinion of PCT Application No. PCT/JP2019/043110, issued on Jan. 21, 2020, 09 pages of ISRWO.

*Primary Examiner* — Mamadou L Diallo
(74) *Attorney, Agent, or Firm* — CHIP LAW GROUP

(57) ABSTRACT

The solid-state imaging apparatus (1) according to the present disclosure includes a semiconductor layer (51), a light shield wall (60b), and an insulation layer. The semiconductor layer (51) is provided with a plurality of photoelectric conversion units and a plurality of charge retention units that retain charge generated by the photoelectric conversion units (26). The light shield wall (60b) is provided inside a trench (51a) formed in a depth direction from a light-incident side between the photoelectric conversion units and the charge retention units (26) adjacent to each other in the semiconductor layer (51). The insulation layer is provided on a side of the semiconductor layer (51) opposite (Continued)

from the light-incident side, and having an opening (53*a*) that surrounds the trench (51*a*).

13 Claims, 19 Drawing Sheets

(52) U.S. Cl.
CPC .. *H01L 27/14643* (2013.01); *H01L 27/14685* (2013.01); *H01L 27/14689* (2013.01)

(58) Field of Classification Search
CPC ......... H01L 27/14636; H01L 27/14685; H01L 27/14612; H04N 25/70; H04N 25/77
See application file for complete search history.

(56) References Cited

U.S. PATENT DOCUMENTS

| | | | |
|---|---|---|---|
| 2012/0033119 A1* | 2/2012 | Shinohara | H01L 27/1464 257/E31.119 |
| 2012/0235266 A1* | 9/2012 | Ootsuka | H01L 27/14625 257/E31.127 |
| 2014/0054662 A1* | 2/2014 | Yanagita | H01L 27/14645 438/73 |
| 2015/0155327 A1* | 6/2015 | Kuboi | H01L 27/14689 257/292 |
| 2018/0286899 A1* | 10/2018 | Muramatsu | H01L 27/14685 |
| 2019/0157330 A1 | 5/2019 | Sato et al. | |

FOREIGN PATENT DOCUMENTS

| | | | | |
|---|---|---|---|---|
| CN | 109314123 A | 2/2019 | | |
| EP | 3483938 A1 | 5/2019 | | |
| JP | 2013-191869 A | 9/2013 | | |
| JP | 2018-117156 A | 7/2018 | | |
| KR | 10-2014-0015326 A | 2/2014 | | |
| KR | 10-2019-0024895 A | 3/2019 | | |
| WO | 2012/117931 A1 | 9/2012 | | |
| WO | 2018/008614 A1 | 1/2018 | | |
| WO | WO-2018008614 A1 * | 1/2018 | ........... | H01L 27/146 |

* cited by examiner

SOLID-STATE IMAGING APPARATUS, METHOD OF MANUFACTURING THE SAME, AND ELECTRONIC DEVICE

CROSS REFERENCE TO RELATED APPLICATIONS

This application is a U.S. National Phase of International Patent Application No. PCT/JP2019/043110 filed on Nov. 1, 2019, which claims priority benefit of Japanese Patent Application No. JP 2018-211638 filed in the Japan Patent Office on Nov. 9, 2018. Each of the above-referenced applications is hereby incorporated herein by reference in its entirety.

TECHNICAL FIELD

The present disclosure relates to a solid-state imaging apparatus, a method of manufacturing the same, and an electronic device.

BACKGROUND ART

Recently, in back-illuminated complementary metal-oxide-semiconductor (CMOS) image sensors, there is a technology that reduces the spillover of light from adjacent unit pixels by forming a wall-like light shield wall between the adjacent unit pixels (for example, see Patent Document 1).

CITATION LIST

Patent Document

Patent Document 1: Japanese Patent Application Laid-Open No. 2013-191869

SUMMARY OF THE INVENTION

Problems to be Solved by the Invention

However, with the above technology of the related art, the light-shielding properties provided by the light shield wall are inadequate, and there is room for improvement with regard to reducing the spillover of light from adjacent unit pixels.

Accordingly, the present disclosure proposes a solid-state imaging apparatus, a method of manufacturing the same, and an electronic device capable of reducing the spillover of light from adjacent unit pixels.

Solutions to Problems

According to the present disclosure, there is provided a solid-state imaging apparatus. The solid-state imaging apparatus includes a semiconductor layer, a light shield wall, and an insulation layer. The semiconductor layer is provided with a plurality of photoelectric conversion units and a plurality of charge retention units that retain charge generated by the photoelectric conversion units. The light shield wall is provided inside a trench formed in a depth direction from a light-incident side between the photoelectric conversion units and the charge retention units adjacent to each other in the semiconductor layer. The insulation layer is provided on a side of the semiconductor layer opposite from the light-incident side, and having an opening that surrounds the trench.

Furthermore, according to the present disclosure, there is provided a solid-state imaging apparatus. The solid-state imaging apparatus includes a semiconductor layer, a light shield wall, and an insulation layer. The semiconductor layer is provided with a plurality of photoelectric conversion units. The light shield wall is provided inside a trench formed in a depth direction from a light-incident side between the photoelectric conversion units adjacent to each other in the semiconductor layer. The insulation layer is provided on a side of the semiconductor layer opposite from the light-incident side, and having an opening that surrounds the trench.

Furthermore, according to the present disclosure, there is provided a method of manufacturing a solid-state imaging apparatus. The method of manufacturing the solid-state imaging apparatus includes the steps of forming an insulation layer in a semiconductor substrate, forming an opening in a predetermined region of the insulation layer, forming another insulation layer to bury the opening, and grinding a face on a side of the semiconductor substrate opposite from a side on which the insulation layer is formed. Furthermore, the method of manufacturing the solid-state imaging apparatus includes the steps of forming a trench in a depth direction going from the ground face of the semiconductor substrate toward the opening, and forming a light shield wall inside the trench.

Effects of the Invention

According to the present disclosure, the spillover of light from adjacent unit pixels can be reduced. Note that, the effect described here is not necessarily limited, and can be any effect described in the present disclosure.

MODE FOR CARRYING OUT THE INVENTION

Hereinafter, embodiments of the present disclosure will be described in detail on the basis of the drawings. Note that in the following embodiments, the same portions are denoted with the same signs, and duplicate description is omitted.

First Embodiment

[Configuration of Solid-State Imaging Apparatus]

Figure 1:
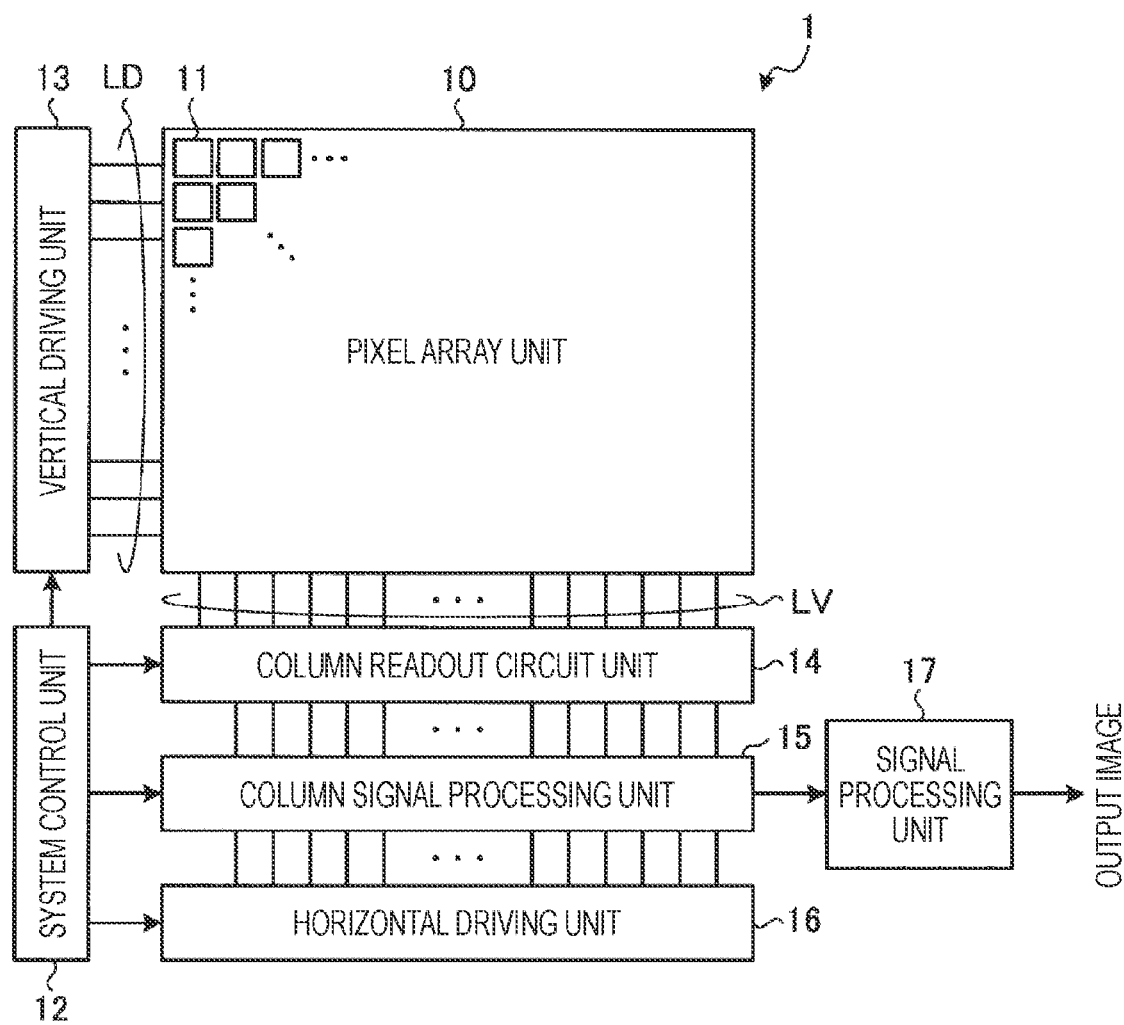
FIG. 1 is a system configuration diagram illustrating a schematic configuration example of a solid-state imaging apparatus according to a first embodiment of the present disclosure.

FIG. 1 is a system configuration diagram illustrating a schematic configuration example of a solid-state imaging apparatus 1 according to a first embodiment of the present disclosure. As illustrated in FIG. 1, a solid-state imaging apparatus 1 that acts as a CMOS image sensor is provided with a pixel array unit 10, a system control unit 12, a vertical driving unit 13, a column readout circuit unit 14, a column signal processing unit 15, a horizontal driving unit 16, and a signal processing unit 17.

The pixel array unit 10, the system control unit 12, the vertical driving unit 13, the column readout circuit unit 14, the column signal processing unit 15, the horizontal driving unit 16, and the signal processing unit 17 are provided on the same semiconductor substrate or on a plurality of electrically connected, laminated semiconductor substrates.

In the pixel array unit 10, effective unit pixels (hereinafter also referred to as "unit pixels") 11 are arranged in a two-dimensional array of rows and columns, each including a photoelectric conversion element (photodiode 21 (see FIG. 2)) capable of photoelectrically converting and internally storing an amount of electric charge corresponding to the amount of incident light, and outputting the electric charge as a signal.

Also, besides the effective unit pixels 11, the pixel array unit 10 may include a region in which pixels such as dummy unit pixels having a structure without the photodiode 21 and shielded unit pixels whose light-receiving face is shielded to block incident light from the outside are arranged in rows and/or columns in some cases.

Note that the shielded unit pixels may be provided with a configuration similar to the effective unit pixels 11 except for the structure that shields the light-receiving face. Also, in the following, the photoelectric charge having an amount of electric charge corresponding to the amount of incident light is also simply referred to as the "charge", and the unit pixels 11 are also simply referred to as the "pixels" in some cases.

In the pixel array unit 10, a pixel driving line LD for each row is formed in the horizontal direction of the diagram (the direction in which pixels are arrayed in pixel rows) and a vertical pixel line LV for each column is formed in the vertical direction of the diagram (the direction in which pixels are arrayed in pixel columns) with respect to the pixel array of rows and columns. One end of each pixel driving line LD is connected to an output end corresponding to each row of the vertical driving unit 13.

The column readout circuit unit 14 at least includes components such as a circuit that supplies a constant current for each column to the unit pixels 11 in a selected row of the pixel array unit 10, a current mirror circuit, and a switch for toggling which unit pixels 11 are to be read out.

In addition, the column readout circuit unit 14 forms an amplifier together with a transistor in a selected pixel of the pixel array unit 10, converts a photoelectric signal into a voltage signal, and outputs the voltage signal to the vertical pixel line LV.

The vertical driving unit 13 includes components such as a shift register and an address decoder, and drives each of the unit pixels 11 of the pixel array unit 10 together simultaneously or in units of rows or the like. Although the specific configuration of the vertical driving unit 13 is omitted from illustration, the configuration includes a readout scanning system and a sweep scanning system or a bulk sweep and bulk transfer system.

The readout scanning system reads out pixel signals from the unit pixels 11, and selectively scans the unit pixels 11 of the pixel array unit 10 sequentially in units of rows. In the case of row driving (rolling shutter operation), sweeping is performed by sweep scanning ahead of the readout scanning performed by the readout scanning system by an amount of time equal to the shutter speed.

Also, in the case of global exposure (global shutter operation), bulk sweeping is performed ahead of bulk transfer by an amount of time equal to the shutter speed. Through such sweeping, unwanted charge is swept (reset) from the photodiodes 21 of the unit pixels 11 in the readout row. Additionally, by sweeping (resetting) the unwanted charge, what is referred to as an electronic shutter operation is performed.

Here, an electronic shutter operation refers to an operation of discarding unwanted photoelectric charge previously accumulated in the photodiodes 21 and starting a new exposure (starting the storage of photoelectric charge).

The signal read out through the readout operation by the readout scanning system corresponds to the amount of light incident since the previous readout operation or electronic shutter operation. In the case of row driving, the period from the readout timing by the previous readout operation or the sweep timing by the previous electronic shutter operation until the readout timing by the current readout operation is the photoelectric charge storage time (exposure time) in the unit pixels 11. In the case of global exposure, the time from bulk sweep to bulk transfer is the storage time (exposure time).

The pixel signals output from each of the unit pixels 11 of a pixel row selectively scanned by the vertical driving unit 13 are supplied to the column signal processing unit 15 through each of the vertical pixel lines LV. For every pixel column of the pixel array unit 10, the column signal processing unit 15 performs predetermined signal processing on the pixel signals output through the vertical pixel lines LV from each of the unit pixels 11 in the selected row, and also temporarily holds the processed pixel signals.

Specifically, the column signal processing unit 15 at least performs a noise removal process such as correlated double sampling (CDS) for example as the signal processing. Through the CDS process by the column signal processing unit 15, pixel-specific fixed-pattern noise such as reset noise and threshold inconsistencies in an amplification transistor AMP is removed.

Note that besides a noise removal process, the column signal processing unit 15 may also be provided with an AD conversion function and configured to output pixel signals as digital signals, for example.

The horizontal driving unit 16 contains components such as a shift register and an address decoder, and sequentially selects a unit circuit corresponding to a pixel column of the column signal processing unit 15. Pixel signals processed by the column signal processing unit 15 are sequentially output to the signal processing unit 17 through the selective scanning by the horizontal driving unit 16.

The system control unit 12 includes components such as a timing generator that generating various timing signals, and controls the driving of the vertical driving unit 13, the column signal processing unit 15, the horizontal driving unit 16, and the like on the basis of the various timing signals generated by the timing generator.

Additionally, the solid-state imaging apparatus 1 is provided with the signal processing unit 17 and a data storage unit not illustrated. The signal processing unit 17 at least has an adding processing function, and performs various types of signal processing such as a process of adding together pixel signals output from the column signal processing unit 15.

During the signal processing by the signal processing unit 17, the data storage unit temporarily stores data necessary for the processing. The signal processing unit 17 and the data storage unit may be external signal processing units provided on a different substrate from the solid-state imaging apparatus 1, may be processes by a digital signal processor (DSP) or software for example, or may be mounted on the same substrate as the solid-state imaging apparatus 1.

[Configuration of Unit Pixel]

Figure 2:
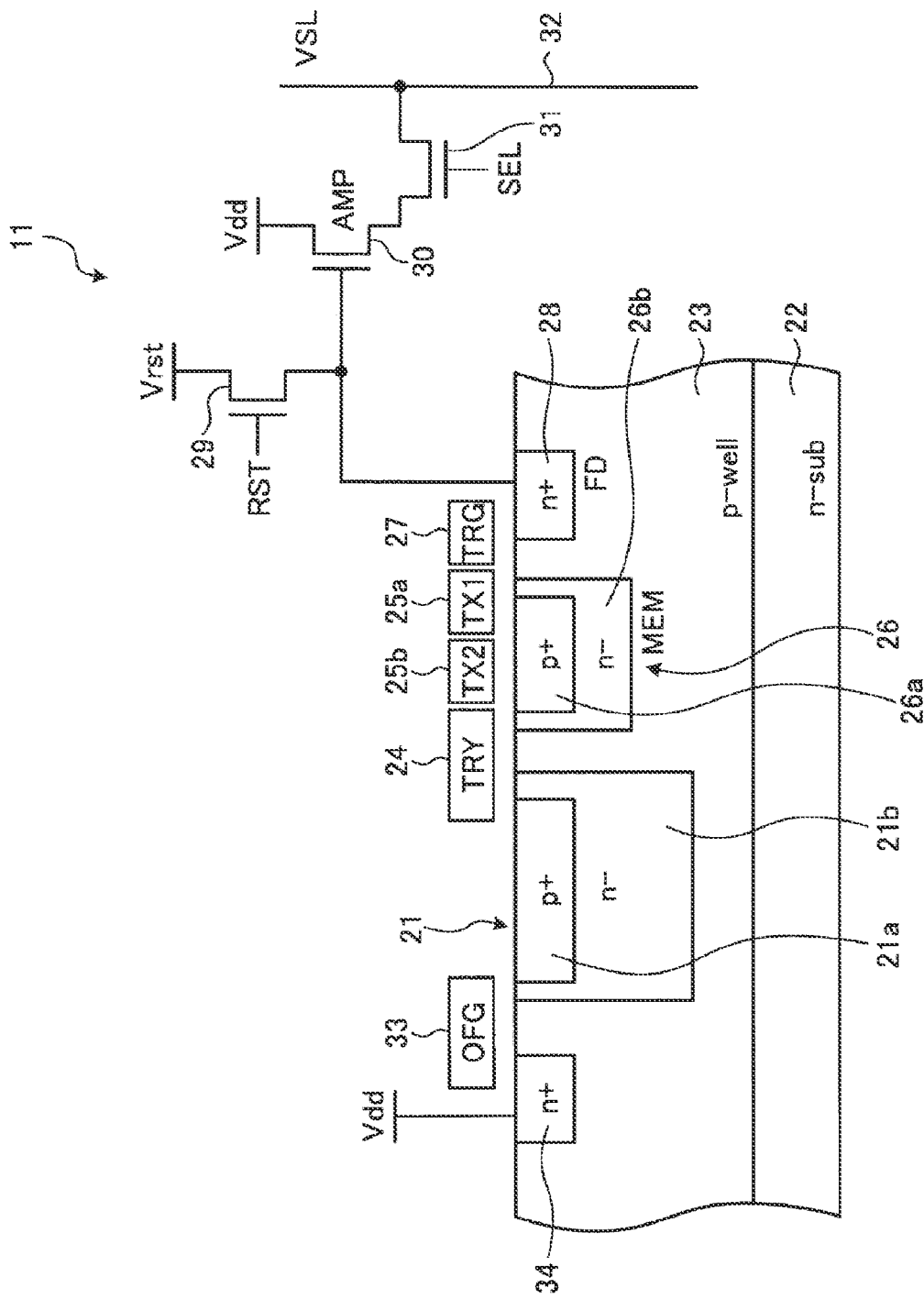
FIG. 2 is a circuit diagram illustrating a configuration example of a unit pixel in the solid-state imaging apparatus according to the first embodiment of the present disclosure.

Next, a specific structure of one of the unit pixels 11 arrayed in rows and columns in the pixel array unit 10 will be described with reference to FIG. 2. FIG. 2 is a circuit diagram illustrating a configuration example of a unit pixel 11 in the solid-state imaging apparatus 1 according to the first embodiment of the present disclosure.

The unit pixel 11 is provided with the photodiode (PD) 21. The photodiode 21 is an example of a photoelectric conversion unit. The photodiode 21 is formed by forming a p-type layer 21a near the substrate surface and embedding an n-type embedded layer 21b in a p-well layer 23 formed on an n-type substrate 22, for example.

In other words, such a photodiode 21 is an embedded photodiode. Note that the n-type embedded layer 21b has an impurity concentration so as to be in a depleted state when charge is flushed.

In addition to the photodiode 21, the unit pixel 11 is provided with a TRY gate 24, a TX1 gate 25a, a TX2 gate 25b, and a charge retention unit (MEM) 26. The TRY gate 24 is connected between the photodiode 21 and the charge retention unit 26. The TX1 gate 25a and the TX2 gate 25b are disposed near the charge retention unit 26.

The charge retention unit 26 is formed by forming a p-type layer 26a near the substrate surface and embedding an n-type embedded layer 26b in the p-well layer 23 formed on the n-type substrate 22, for example.

Note that in the first embodiment, the n-type embedded layer 26b of the charge retention unit 26 may also be formed by an n-type diffusion region. Specifically, it is enough to form an n-type diffusion region inside the p-well layer 23, and form the p-type layer 26a near the substrate surface.

With this arrangement, dark current that occurs at the Si—SiO$_2$ interface can be deterred from being stored in the n-type diffusion region of the charge retention unit 26, and the image quality of the solid-state imaging apparatus 1 can be improved.

At the TRY gate 24, applying a driving signal TRY to the gate electrode causes photoelectric conversion to occur in the photodiode 21, and causes the charge stored inside the photodiode 21 to be transferred to the charge retention unit 26. In addition, the TRY gate 24 also functions as a gate for preventing the backflow of charge from the charge retention unit 26 to the photodiode 21.

The TX1 gate 25a functions as a gate when transferring charge from the charge retention unit 26 to a floating diffusion (FD) 28 described later. In addition, the TX1 gate 25a also functions as a gate for keeping charge in the charge retention unit 26.

The TX2 gate 25b functions as a gate when transferring charge from the photodiode 21 to the charge retention unit 26. In addition, the TX2 gate 25b also functions as a gate for keeping charge in the charge retention unit 26.

A modulation is applied to the charge retention unit 26 by applying a driving signal TX2 and a driving signal TX1 to the gate electrode of the TX2 gate 25b and the gate electrode of the TX1 gate 25a, respectively.

In other words, by applying the driving signal TX2 and the driving signal TX1 to the gate electrode of the TX2 gate 25b and the gate electrode of the TX1 gate 25a, respectively, the potential of the charge retention unit 26 can be deepened. With this arrangement, the saturation charge of the charge retention unit 26 can be increased over the case where the modulation is not applied.

Also, the unit pixel 11 is additionally provided with a TRG gate 27 and a floating diffusion 28. At the TRG gate 27, applying a driving signal TRG to the gate electrode causes the charge stored in the charge retention unit 26 to be transferred to the floating diffusion 28.

The floating diffusion 28 is a charge-to-voltage conversion unit including an n-type layer, and converts the charge transferred from the charge retention unit 26 by the TRG gate 27 to a voltage.

The unit pixel 11 is additionally provided with a reset transistor (RST) 29, an amplification transistor (AMP) 30, and a select transistor (SEL) 31. Note that the example of FIG. 2 illustrates a case in which an n-channel MOS transistor is used in the reset transistor 29, the amplification transistor 30, and the select transistor 31.

However, the configuration of the reset transistor 29, the amplification transistor 30, and the select transistor 31 is not limited to the example illustrated in FIG. 2.

The reset transistor 29 is connected between a power supply Vrst and the floating diffusion 28. At the reset transistor 29, applying a driving signal RST to the gate electrode causes the floating diffusion 28 to be reset.

In the amplification transistor 30, the drain electrode is connected to a power source Vdd while the gate electrode is connected to the floating diffusion 28, and the amplification transistor 30 reads out the voltage of the connected floating diffusion 28.

In the select transistor 31, the drain electrode is connected to the source electrode of the amplification transistor 30, while the source electrode is connected to a vertical signal line (VSL) 32. Applying a driving signal SEL to the gate electrode causes the select transistor 31 to select the unit pixel 11 from which to read out a pixel signal.

Note that although the example of FIG. 2 illustrates a case in which the select transistor 31 is connected between the source electrode of the amplification transistor 30 and the vertical signal line 32, the select transistor 31 may also be connected between the power supply Vdd and the drain electrode of the amplification transistor 30.

Note that in the first embodiment, the reset transistor 29, the amplification transistor 30, and the select transistor 31 may also be omitted depending on the method of reading out one or a plurality of pixel signals.

Also, in the first embodiment, an overflow gate (OFG) 33 for preventing blooming is provided in the unit pixel 11. At such an overflow gate 33, applying a driving signal OFG to the gate electrode at the start of exposure causes the charge in the photodiode 21 to be flushed to an n-type layer 34 connected to the power supply Vdd.

The solid-state imaging apparatus 1 including a plurality of the unit pixel 11 described above is capable of achieving a global shutter operation (global exposure) by starting the exposure for all pixels at the same time and ending the exposure for all pixels at the same time. Additionally, through the global shutter operation, undistorted imaging in which the exposure period is the same for all pixels can be achieved.

Note that the example of FIG. 2 illustrates a case of configuring the unit pixel 11 by forming an n-type embedded channel in the p-type p-well layer 23, but components with respectively opposite conductivity types may also be used. In this case, the potential relationships described later are all reversed.

[Unit Pixel Light Shield Structure]

Figure 3:
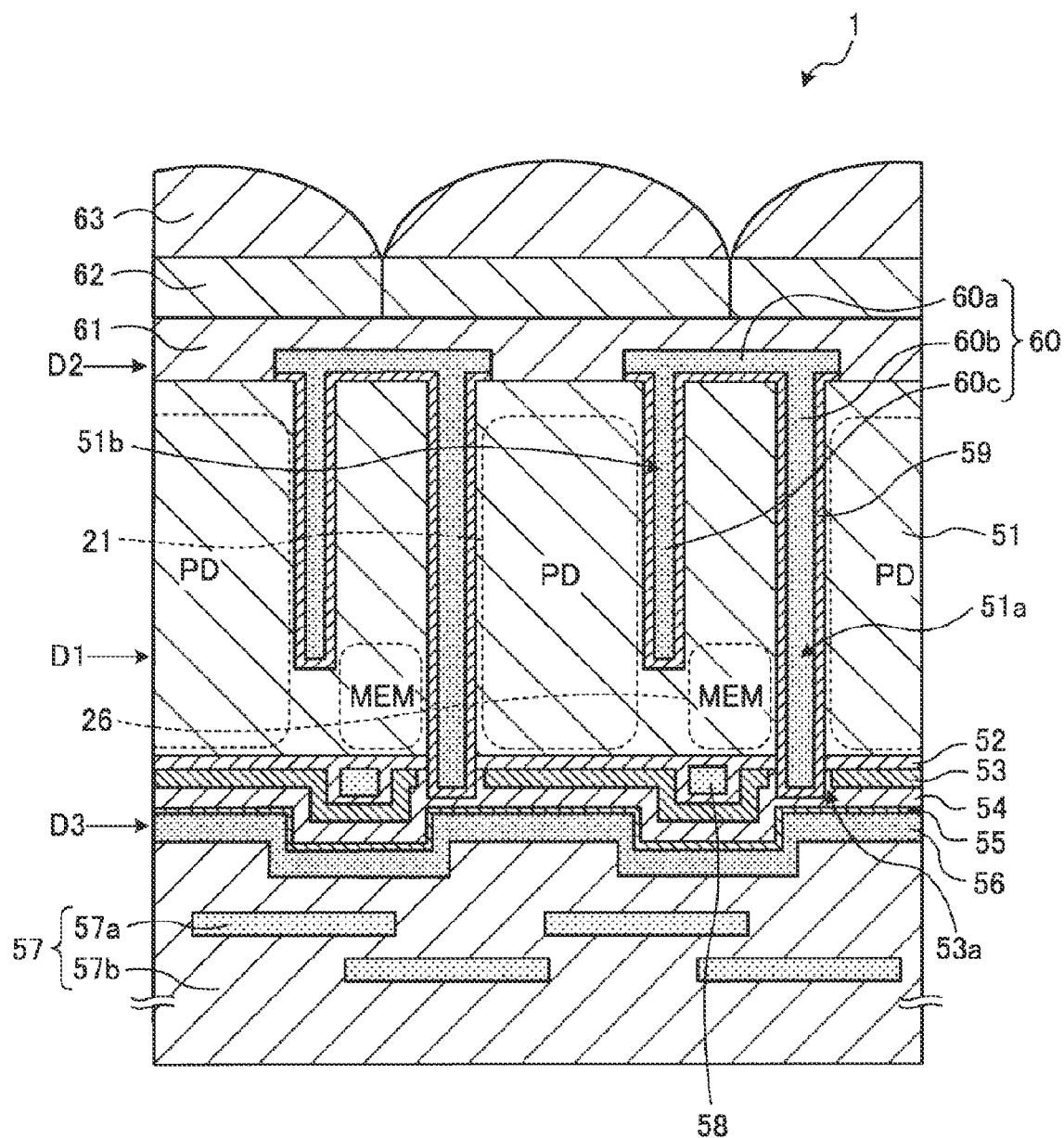
FIG. 3 is a cross section schematically illustrating a light shield structure of the solid-state imaging apparatus according to the first embodiment of the present disclosure.

Next, a light shield structure of the solid-state imaging apparatus 1 in the first embodiment will be described with reference to FIG. 3. FIG. 3 is a cross section schematically illustrating a light shield structure of the solid-state imaging apparatus 1 according to the first embodiment of the present disclosure.

In the solid-state imaging apparatus 1 according to the first embodiment, a semiconductor layer 51, an SiO layer 52, an LP-SiN layer 53, a P—SiN layer 54, an SiO layer 55, a light shield layer 56, and a wiring layer 57 are layered in order from the top of FIG. 3. Note that the LP-SiN layer 53 is an example of an insulation layer, and the P—SiN layer 54 is an example of another insulation layer.

Also, a gate electrode 58 is provided at predetermined positions inside a multilayer insulating film including the SiO layer 52, the LP-SiN layer 53, the P—SiN layer 54, and the SiO layer 55.

Additionally, the solid-state imaging apparatus 1 according to the first embodiment is a back-illuminated image sensor in which the photodiode 21 is irradiated with light from the back face on the opposite side from the front face of the semiconductor layer 51 on which the wiring layer 57 is layered.

On the back face of the semiconductor layer 51 that is irradiated with light from an external source, a planarizing film 61, a color filter 62, and microlenses 63 are layered, for example. Also, although omitted from illustration, a support substrate is layered under the wiring layer 57, for example.

Note that in the following, the back face of the semiconductor layer 51 is also referred to as the incident face, and the front face of the semiconductor layer 51 where the boundary with the wiring layer 57 is disposed is also referred to as the boundary face. Also, in the following, the face of the photodiode 21 on the incident face side of the semiconductor layer 51 is referred to as the light-receiving face, while the face on the opposite side from the light-receiving face is referred to as the bottom face. Also, in the following, the face of the charge retention unit 26 on the incident face side of the semiconductor layer 51 is also referred to as the top face, while the face on the opposite side from the top face is also referred to as the bottom face.

The semiconductor layer 51 contains silicon, for example. The semiconductor layer 51 includes a plurality of photodiodes 21 and a plurality of charge retention units 26. Note that a pair of a photodiode 21 and a charge retention unit 26 is provided in a single unit pixel 11 (see FIG. 1).

The SiO layer 52 contains a silicon oxide film, for example. Such a SiO layer 52 has a function of acting as a gate insulating layer between the semiconductor layer 51 and gate electrode 58. Such a gate electrode 58 corresponds to the gate electrode of the TRY gate 24 illustrated in FIG. 2, for example.

The low pressure (LP)-SiN layer 53 contains a silicon nitride film deposited by low pressure chemical vapor deposition (CVD), for example. Such a LP-SiN layer 53 has a higher film density than the surrounding SiO layer 52, P—SiN layer 54, and SiO layer 55.

The plasma (P)-SiN layer 54 contains a silicon nitride film deposited by plasma CVD, for example. The SiO layer 55 contains a silicon oxide film, for example.

The multilayer insulating film including the SiO layer 52, the LP-SiN layer 53, the P—SiN layer 54, and the SiO layer 55 described so far is used to form device structures such as the TRY gate 24 in the solid-state imaging apparatus 1 according to the first embodiment.

It is beneficial to set the SiO layer 52 to a thickness of 10 nm or greater, for example. This is the thickness necessary to adjust the depth of a trench penetrating the semiconductor layer 51 for forming a light shield wall 60b (described later), for example. On the other hand, the SiO layer 52 also doubles as an insulating film between the gate electrode 58 and the semiconductor layer 51, and a film that is too thick is undesirable. Consequently, it is beneficial to set the thickness of the SiO layer 52 in the range from 10 nm to 20 nm, for example.

It is beneficial to set the multilayer film including the LP-SiN layer 53 and the P—SiN layer 54 to a thickness of 50 nm or greater, for example. This is the thickness necessary to adjust a contact formed in the wiring layer 57 and also to control a trench 51a (described later) penetrating the semiconductor layer 51 for forming the light shield wall 60b, for example.

Such a thickness is the thickness necessary for the trench for forming the contact to reach the semiconductor layer 51, and to prevent the semiconductor layer 51 from being damaged by the processing of the contact, for example. Also, such a thickness is the thickness necessary to stop the trench 51a penetrating the semiconductor layer 51 for forming the light shield wall 60b with the multilayer film.

However, from the viewpoint of making the solid-state imaging apparatus 1 thinner and the like, it is undesirable for the multilayer film including the LP-SiN layer 53 and the P—SiN layer 54 to be too thick. Consequently, it is beneficial to set the thickness of the multilayer film including the LP-SiN layer 53 and the P—SiN layer 54 in the range from 50 nm to 100 nm, for example.

It is beneficial to set the SiO layer 55 to a thickness of 25 nm or greater, for example. This is the thickness necessary to keep the SiO layer 55 from being damaged while processing the light shield layer 56 and thereby exposing the multilayer film of the LP-SiN layer 53 and the P—SiN layer 54, for example.

However, from the viewpoint of making the solid-state imaging apparatus 1 thinner and the like, it is undesirable for the SiO layer 55 to be too thick. Consequently, it is beneficial to set the thickness of the SiO layer 55 in the range from 30 nm to 100 nm, for example.

The light shield layer 56 contains a metal film with light-shielding properties, for example. The material of the light shield layer 56 may be any material that shields light, and for example, a material such as tungsten (W), aluminum (Al), or copper (Cu) can be used.

The light shield layer 56 blocks light passing through the semiconductor layer 51 without being absorbed by the photodiode 21 from being incident on the wiring layer 57. This arrangement makes it possible to reduce the spillover of light into an adjacent charge retention unit 26 or the like when light passing through the semiconductor layer 51 is incident on the wiring layer 57 and reflected by a wiring film 57a in the wiring layer 57.

Note that although the example of FIG. 3 illustrates a case in which the light shield layer 56 is disposed to cover the bottom face side of the photodiode 21 and the charge retention unit 26, the placement of the light shield layer 56 is not limited to such an example. For example, in the first embodiment, the light shield layer 56 may also be disposed to cover only the bottom face side of the charge retention unit 26.

The wiring layer 57 includes a plurality of wiring films 57a and an interlayer insulating film 57b. The wiring films 57a contain materials such as aluminum and copper, while the interlayer insulating film 57b contains a silicon oxide film or the like.

Also, in the region between the wiring films 57a and the gate electrode 58, an opening not illustrated is formed in the light shield layer 56, and furthermore, a through-via not illustrated inserted through the opening is formed. With this arrangement, the wiring films 57a and the gate electrode 58 are electrically connected.

In the semiconductor layer 51, a trench 51a and a trench 51b are formed between the photodiode 21 and the charge retention unit 26 adjacent to each other. The trench 51a is formed to penetrate the semiconductor layer 51 in the depth direction from the incident face of the semiconductor layer 51. The trench 51b is formed to extend from the incident face of the semiconductor layer 51 partway into the semiconductor layer 51 in the depth direction, without penetrating through the semiconductor layer 51.

Additionally, a multilayer film 59 and a light shield 60 are provided in the trenches 51a and 51b and on the incident face of the semiconductor layer 51. The multilayer film 59 is formed on the incident face of the semiconductor layer 51 and on the inner walls of the trenches 51a and 51b. The multilayer film 59 includes a fixed-charge film, an anti-reflection film, and an insulating film, for example.

The light shield 60 formed on the front face of the multilayer film 59 contains a metal film with light-shielding properties, for example. The light shield 60 may be any material that shields light, and for example, a material such as tungsten, aluminum, or copper can be used.

Such a light shield 60 reduces the direct or indirect spillover of light incident from the incident face of the semiconductor layer 51 into the charge retention unit 26. The light shield 60 includes a surface light shield 60a, a light shield wall 60b, and a non-penetrating light shield wall 60c.

The surface light shield 60a covers a region excluding the area above the light-receiving face of the photodiode 21 on the incident face of the semiconductor layer 51. In other words, the surface light shield 60a covers a region of the light-receiving face of the semiconductor layer 51 excluding the region where light is incident on the photodiode 21.

The light shield wall 60b penetrates the semiconductor layer 51 from the incident face of the semiconductor layer 51, and reaches the bottom face of the semiconductor layer 51. The non-penetrating light shield wall 60c extends from the incident face of the semiconductor layer 51 partway into the semiconductor layer 51, without penetrating through the semiconductor layer 51.

The light shield wall 60b is disposed between the photodiode 21 and the charge retention unit 26 adjacent to each other and provided inside different unit pixels 11, for example. The non-penetrating light shield wall 60c is disposed between the photodiode 21 and the charge retention unit 26 inside the same unit pixel 11, for example.

Here, in the first embodiment, an opening 53a is provided in the LP-SiN layer 53 to surround the trench 51a penetrating through the semiconductor layer 51, as illustrated in FIG. 3. In other words, the opening 53a is provided in the region where the trench 51a is formed in the LP-SiN layer 53.

Figure 4A:
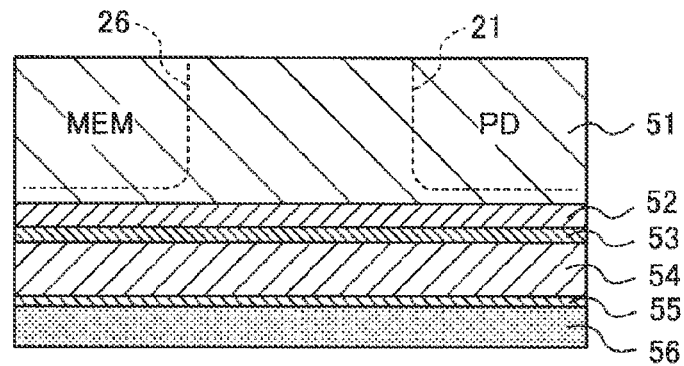
FIG. 4A is an enlarged cross section schematically illustrating a manufacturing process for a solid-state imaging apparatus according to a reference example.
Figure 4B:
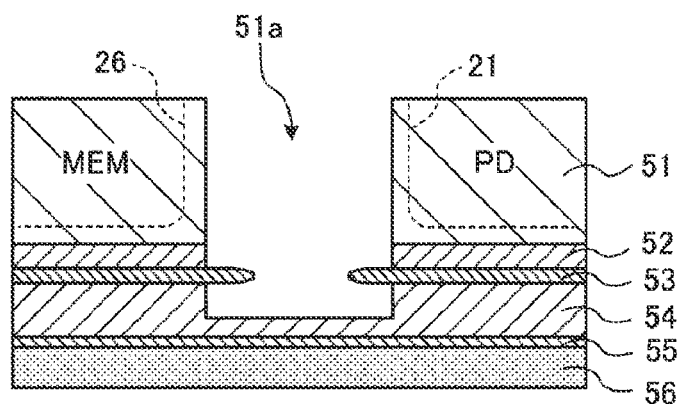
FIG. 4B is an enlarged cross section schematically illustrating a manufacturing process for a solid-state imaging apparatus according to a reference example.
Figure 4C:
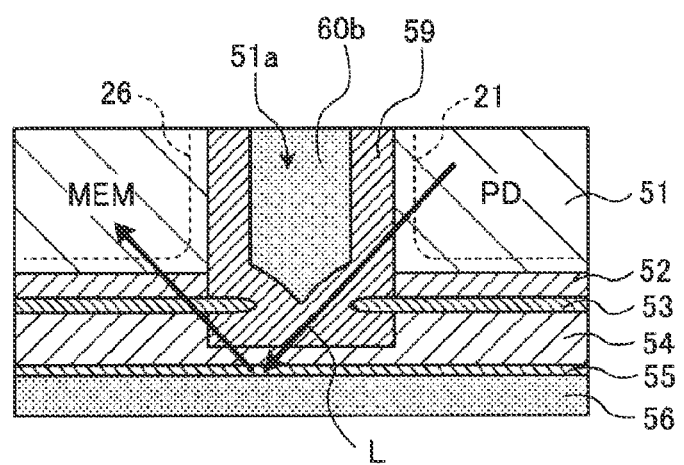
FIG. 4C is an enlarged cross section schematically illustrating a manufacturing process for a solid-state imaging apparatus according to a reference example.

Next, the effects of such an opening 53a will be described with reference to FIGS. 4A, 4B, 4C, 5A, 5B, and 5C. FIGS. 4A, 4B, and 4C are enlarged cross sections schematically illustrating a manufacturing process for the solid-state imaging apparatus 1 according to a reference example, and are enlarged views of the region where the trench 51a and the light shield layer 56 are close to each other. Also, the reference example illustrated in FIGS. 4A, 4B, and 4C illustrate a case where the opening 53a is not provided in the LP-SiN layer 53.

Note that, although details are omitted, before reaching the state illustrated in FIG. 4A, the photodiode 21 and the charge retention unit 26 are formed on a semiconductor substrate 151 (see FIG. 9A) used to form the semiconductor layer 51.

Also, the SiO layer 52, the LP-SiN layer 53, the P—SiN layer 54, the SiO layer 55, the light shield layer 56, and the wiring layer 57 (see FIG. 3) are layered on the front face of the semiconductor substrate 151, and a support substrate (not illustrated) is applied. Thereafter, the semiconductor layer 51 is formed by grinding the back face of the semiconductor substrate 151 to reach the state illustrated in FIG. 4A.

Additionally, as illustrated in FIG. 4B, to form the light shield wall 60b between the photodiode 21 and the charge retention unit 26 adjacent to each other, the trench 51a is formed between the photodiode 21 and the charge retention unit 26. The trench 51a is formed by forming a hard mask (not illustrated) having a desired aperture on the back face of the semiconductor layer 51, and selectively etching the semiconductor layer 51 in the depth direction through the hard mask, for example.

Also, the etching process that forms the trench 51a uses the multilayer insulating film including the SiO layer 52, the LP-SiN layer 53, the P—SiN layer 54, and the SiO layer 55 as a stopper.

However, because the film density of the LP-SiN layer 53 is high compared to the SiO layer 52, the P—SiN layer 54, and the SiO layer 55, the LP-SiN layer 53 may not be etched sufficiently in some cases. Consequently, in the reference example, the LP-SiN layer 53 remains projecting into the trench 51a, as illustrated in FIG. 4B.

Thereafter, if the multilayer film 59 and the light shield wall 60b are formed inside the trench 51a from the state illustrated in FIG. 4B, the leading end of the shield wall 60b will not be rectangular and instead be wedge-shaped with a narrow point, as illustrated in FIG. 4C.

This occurs because the multilayer film 59 is formed by a method with high coatability such as atomic layer deposition (ALD), and therefore the multilayer film 59 is formed not only on the inner walls of the trench 51a but also on the surface of the projecting LP-SiN layer 53.

Additionally, as illustrated in FIG. 4C, in the reference example, light L from inside the photodiode 21 that reaches the region where the trench 51a and the light shield layer 56 are close to each other may not be blocked by the light shield wall 60b in some cases. Furthermore, in the reference example, light L that is not blocked is reflected by the light shield layer 56, which causes the light L to spill over into the adjacent charge retention unit 26.

As described so far, in the reference example, because the LP-SiN layer 53 remains projecting into the trench 51a, the leading end of the light shield wall 60b takes on a wedge shape with a narrow point, making it difficult to reduce the spillover of light from the adjacent unit pixel 11.

Figure 5A:
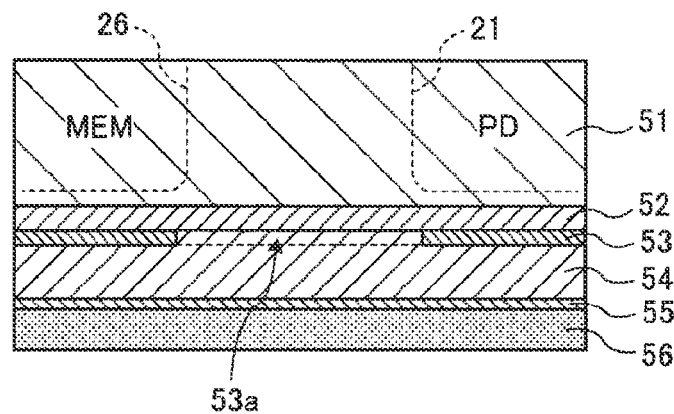
FIG. 5A is an enlarged cross section schematically illustrating a manufacturing process for a solid-state imaging apparatus according to the first embodiment of the present disclosure.
Figure 5B:
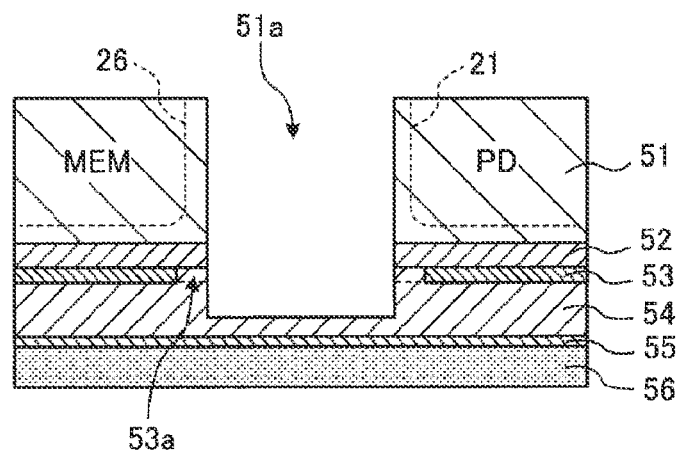
FIG. 5B is an enlarged cross section schematically illustrating a manufacturing process for a solid-state imaging apparatus according to the first embodiment of the present disclosure.
Figure 5C:
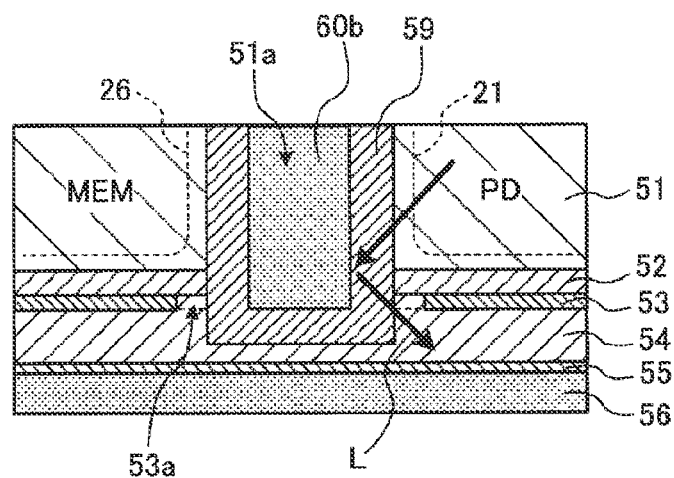
FIG. 5C is an enlarged cross section schematically illustrating a manufacturing process for a solid-state imaging apparatus according to the first embodiment of the present disclosure.

Accordingly, in the first embodiment, the opening 53a is provided in the LP-SiN layer 53 to address the above issue. FIGS. 5A, 5B, and 5C are enlarged cross sections schematically illustrating a manufacturing process for a solid-state imaging apparatus 1 according to the first embodiment of the present disclosure.

Similarly to the reference example, before reaching the state illustrated in FIG. 5A, the photodiode 21 and the charge retention unit 26 are formed on a semiconductor substrate 151 (see FIG. 9A) used to form the semiconductor layer 51.

Also, the SiO layer 52, the LP-SiN layer 53, the P—SiN layer 54, the SiO layer 55, the light shield layer 56, and the wiring layer 57 (see FIG. 3) are layered on the front face of the semiconductor substrate 151, and a support substrate (not illustrated) is applied. Although details will be described later, during the layering step, the opening 53a is provided in the LP-SiN layer 53, and the opening 53a is embedded in the P—SiN layer 54.

Thereafter, the semiconductor layer 51 is formed by grinding the back face of the semiconductor substrate 151 to reach the state illustrated in FIG. 5A.

Additionally, as illustrated in FIG. 5B, to form the light shield wall 60b between the photodiode 21 and the charge retention unit 26 adjacent to each other, the trench 51a is formed between the photodiode 21 and the charge retention unit 26. The trench 51a is formed by forming a hard mask (not illustrated) having a desired aperture on the back face of the semiconductor layer 51, and selectively etching the semiconductor layer 51 in the depth direction through the hard mask, for example.

Also, the etching process that forms the trench 51a uses the multilayer insulating film including the SiO layer 52, the LP-SiN layer 53, the P—SiN layer 54, and the SiO layer 55 as a stopper.

Here, in the first embodiment, the opening 53*a* is provided in advance in the region where the trench 51*a* is to be formed. With this arrangement, as illustrated in FIG. 5B, since the LP-SiN layer 53 is not provided in the region where the trench 51*a* is to be formed in the first place, a situation in which the LP-SiN layer 53 is not etched and remains inside the trench 51*a* can be avoided.

Next, as illustrated in FIG. 5C, the multilayer film 59 is formed using a method such as ALD on the inner walls of the trench 51*a*, and thereafter a metal film is embedded inside the trench 51*a* to form the light shield wall 60*b*. Here, in the first embodiment, because the inner walls of the trench 51*a* are covered substantially uniformly by the multilayer film 59, the shape of the leading end of the light shield wall 60*b* is a rectangular shape similar to the shape of the trench 51*a*.

With this arrangement, as illustrated in FIG. 5C, light L from inside the photodiode 21 that reaches the region where the trench 51*a* and the light shield layer 56 are close to each other can be blocked by the light shield wall 60*b*. Consequently, according to the first embodiment, the spillover of light from the adjacent unit pixel 11 can be reduced.

Also, in the first embodiment, it is beneficial for the size of the opening 53*a* to be larger than the area surrounded by the opening 53*a* in the trench 51*a* as viewed from the light-incident side. This arrangement makes it possible to further avoid having the LP-SiN layer 53 remain projecting into the trench 51*a* when forming the trench 51*a*.

Consequently, according to the first embodiment, the spillover of light from the adjacent unit pixel 11 can be reduced further.

Also, in the first embodiment, it is beneficial for the LP-SiN layer 53 given as one example of an insulation layer to contain a silicon nitride film deposited by low pressure CVD. With this arrangement, reliable transistors can be formed inside the solid-state imaging apparatus 1.

Note that although the first embodiment illustrates an example in which the LP-SiN layer 53 contains a silicon nitride film deposited by low pressure CVD, the material of the LP-SiN layer 53 is not limited to such an example. In the first embodiment, the material of the LP-SiN layer 53 may also be a material different from a silicon nitride film deposited by low pressure CVD insofar as the material has a high film density compared to the surrounding SiO layer 52, P—SiN layer 54, and SiO layer 55.

Note that the first embodiment illustrates a case where the multilayer insulating film used when forming device structures such as the TRY gate 24 and also used as a stopper when forming the trench 51*a* has a four-layer structure. However, the multilayer insulating film is not limited to the four-layer structure of the SiO layer 52, the LP-SiN layer 53, the P—SiN layer 54, and the SiO layer 55, and may be any multilayer structure that includes the LP-SiN layer 53.

[Plan-View Structure of Unit Pixel]

Figure 6:
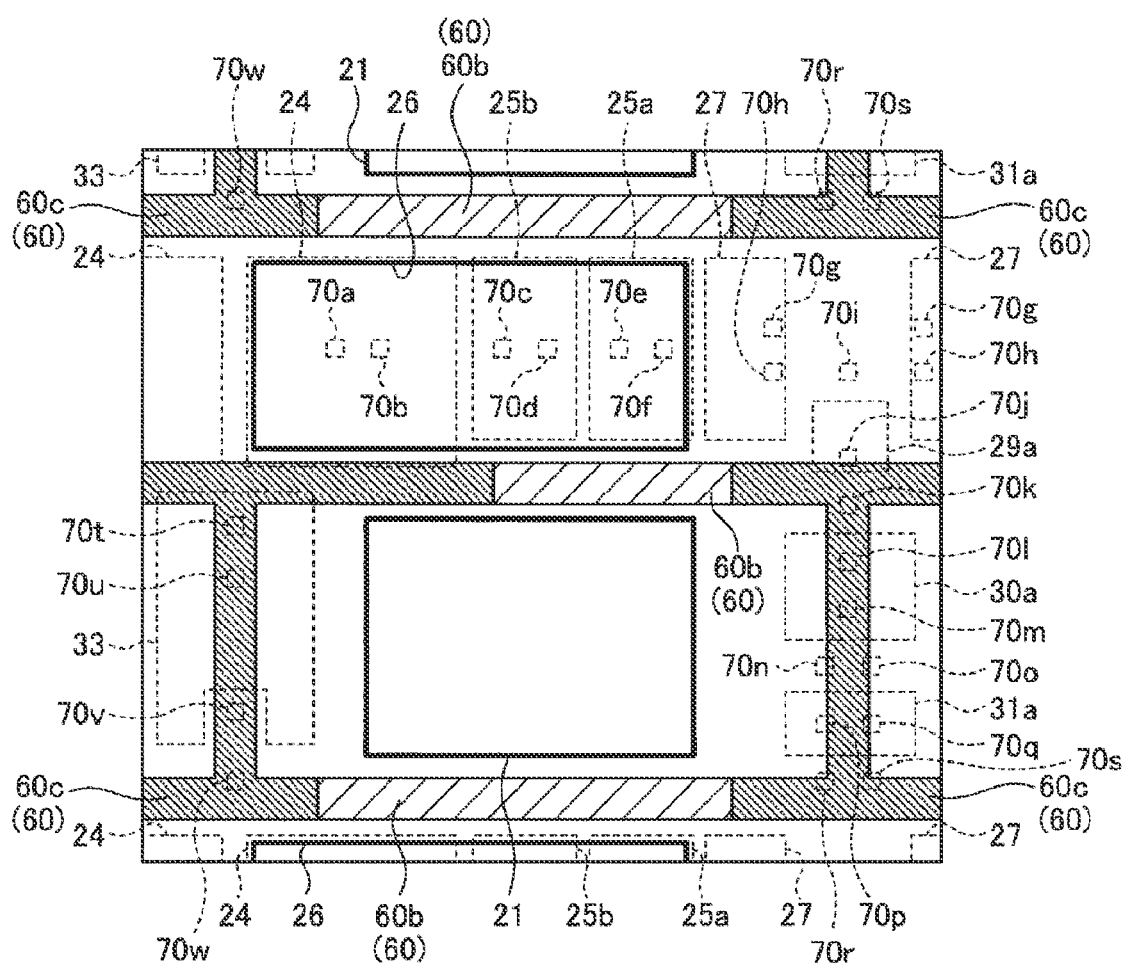
FIG. 6 is a diagram schematically illustrating a plan-view structure of the solid-state imaging apparatus according to the first embodiment of the present disclosure.
Figure 7:
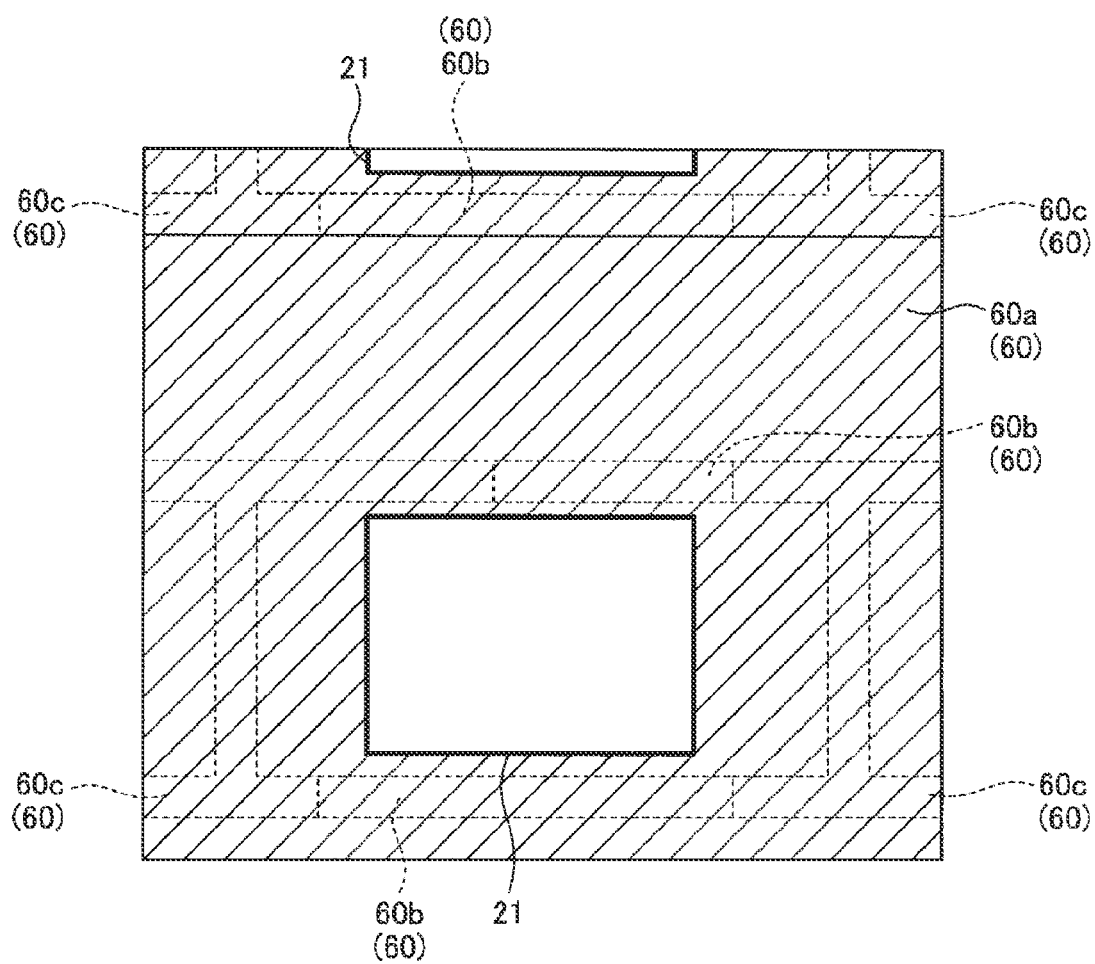
FIG. 7 is a diagram schematically illustrating a plan-view structure of the solid-state imaging apparatus according to the first embodiment of the present disclosure.
Figure 8:
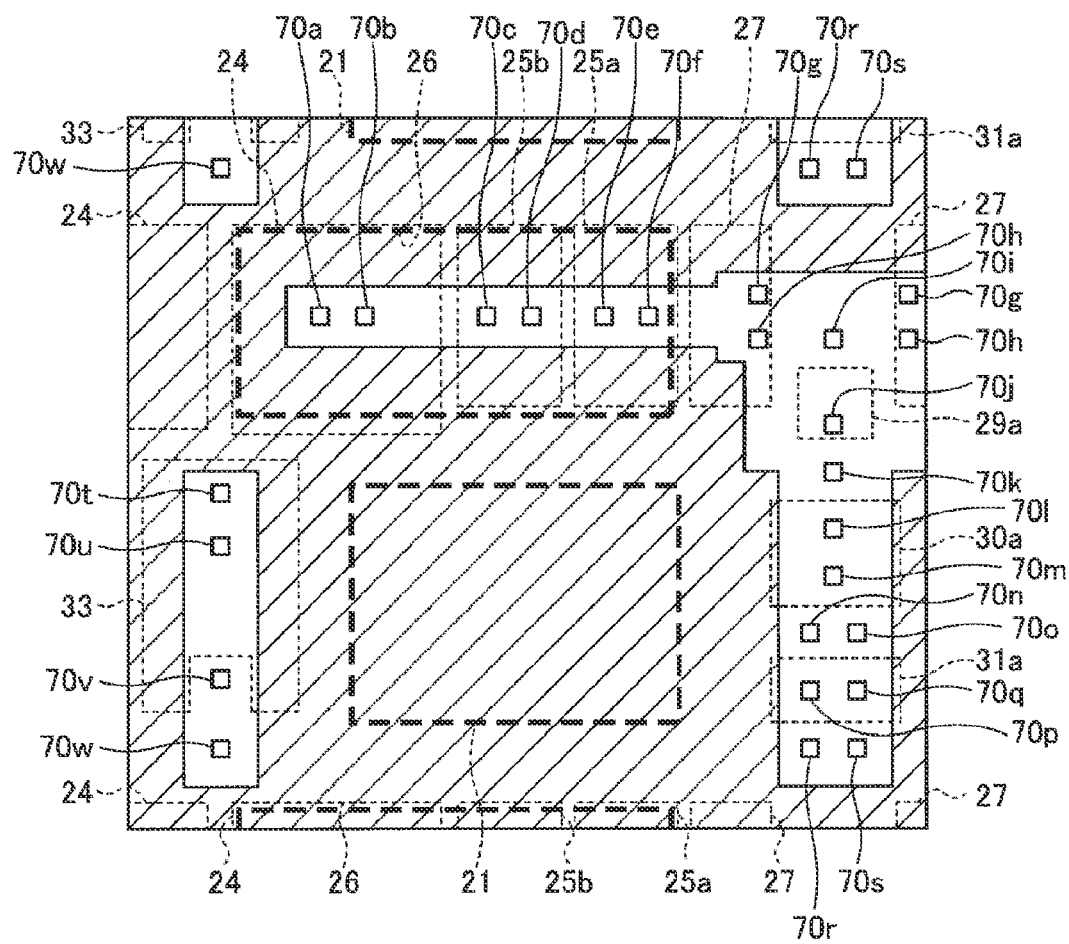
FIG. 8 is a diagram schematically illustrating a plan-view structure of the solid-state imaging apparatus according to the first embodiment of the present disclosure.

Next, a plan-view structure of the solid-state imaging apparatus 1 in the first embodiment will be described with reference to FIGS. 6 to 8. FIGS. 6 to 8 are diagrams schematically illustrating a plan-view structure of the solid-state imaging apparatus 1 according to the first embodiment of the present disclosure.

Note that FIG. 6 illustrates a cross section near the depth D1 illustrated in FIG. 3, while FIG. 7 illustrates a cross section near the depth D2 illustrated in FIG. 3, and FIG. 8 illustrates a cross section near the depth D3 illustrated in FIG. 3. Also, in FIG. 6, the light shield wall 60*b* and the non-penetrating light shield wall 60*c* are shaded differently to distinguish the two more easily. Also, when describing the positional relationships of components in the unit pixels 11 (see FIG. 1), the description will refer to the vertical and horizontal directions illustrated in FIGS. 6 to 8.

Additionally, FIGS. 6 to 8 mainly illustrate a single unit pixel 11, while also illustrating a portion of other unit pixels 11 nearby. Furthermore, the arrangement of components in the vertically adjacent unit pixels 11 is similar to the arrangement of the unit pixel 11 illustrated centrally, while the arrangement of components in the unit pixels 11 adjacent horizontally are mirror images of the unit pixel 11 illustrated centrally.

As illustrated in FIG. 6, the TRY gate 24, the TX2 gate 25*b*, the TX1 gate 25*a*, and the TRG gate 27 are arranged from left to right on top of the photodiode 21.

In substantially the center of the TRY gate 24, a contact 70*a* and a contact 70*b* are arranged horizontally, while in substantially the center of the TX2 gate 25*b*, contact 70*c* and a contact 70*d* are arranged horizontally. Also, in substantially the center of the TX1 gate 25*a*, a contact 70*e* and a contact 70*f* are arranged horizontally. Furthermore, the contacts 70*a* to 70*f* are aligned horizontally.

On the right edge of the TRG gate 27, a contact 70*g* and a contact 70*h* are arranged vertically. Additionally, the charge retention unit 26 is disposed to substantially overlap the TRY gate 24, the TX2 gate 25*b*, and the TX1 gate 25*a*.

To the right of the photodiode 21, a gate part 29*a* of the reset transistor 29 (see FIG. 2), a gate part 30*a* of the amplification transistor 30 (see FIG. 2), and a gate part 31*a* of the select transistor 31 (see FIG. 2) are arranged vertically.

A contact 70*i* is disposed above the gate part 29*a*, and a contact 70*j* is disposed at the lower edge of the gate part 29*a*. A contact 70*k* is disposed between the gate part 29*a* and the gate part 30*a*. In substantially the center of the gate part 30*a*, a contact 70*l* and a contact 70*m* are arranged vertically. The contacts 70*i* to 70*m* are aligned vertically.

A contact 70*n* and a contact 70*o* are arranged horizontally between the gate part 30*a* and the gate part 31*a*, and a contact 70*p* and a contact 70*q* are arranged horizontally in substantially the center of the gate part 31*a*. Below the gate part 31*a*, a contact 70*r* and a contact 70*s* are arranged horizontally.

The contact 70*n*, the contact 70*p*, and the contact 70*r* are aligned vertically. Also, the contact 70*o*, the contact 70*q*, and the contact 70*s* are aligned vertically.

To the left of the photodiode 21, the overflow gate 33 is disposed. In the upper area within the overflow gate 33, a contact 70*t* and a contact 70*u* are arranged vertically. A contact 70*v* is disposed in a recess at the lower end of the overflow gate 33, and a contact 70*w* is disposed below the overflow gate 33. The contacts 70*t* to 70*w* are aligned vertically.

The perimeter (sides) of the photodiode 21 is surrounded by the light shield wall 60*b* and the non-penetrating light shield wall 60*c* of the light shield 60. The light shield wall 60*b* and the non-penetrating light shield wall 60*c* are uninterruptedly joined in a direction parallel to the incident face of the semiconductor layer 51, and uninterruptedly surround the perimeter (sides) of the photodiode 21. In addition, the non-penetrating penetrating light shield wall 60*c* is also uninterruptedly joined to the unit pixels 11 adjacent horizontally.

Of the light shield 60 that surrounds the perimeter of the photodiode 21, the light shield wall 60*b* is disposed between the photodiode 21 and the TX1 gate 25*a* and TX2 gate 25*b* inside the same unit pixel 11 as that photodiode 21. Also, the light shield wall 60b is disposed between the photodiode 21 and the charge retention unit 26 of the unit pixels 11 adjacent vertically.

The non-penetrating light shield wall 60c in the portion other than the above of the light shield 60 that surrounds the perimeter of the photodiode 21. Specifically, the non-penetrating light shield wall 60c is disposed between the photodiode 21 and the unit pixels 11 adjacent horizontally. This arrangement is for forming the gate part of each transistor and the contacts.

Additionally, the non-penetrating light shield wall 60c is disposed between the photodiode 21 and the TRY gate 24 inside the same unit pixel 11. This arrangement is for securing a pathway for current to flow from the photodiode 21 to the charge retention unit 26.

Also, the non-penetrating light shield wall 60c is disposed at the junctions between the non-penetrating light shield wall 60c extending horizontally and the non-penetrating light shield wall 60c extending vertically (the portions where the non-penetrating light shield wall 60c intersects itself). This arrangement is made because if the light shield wall 60b is formed in this portion, etching is accelerated by a microloading effect, and there is a possibility that the light shield wall 60b may reach the wiring layer 57.

As described so far, the sides of the photodiode 21 are surrounded by the non-penetrating light shield wall 60c and the light shield wall 60b. With this arrangement, it is possible to keep light incident on the incident face of the semiconductor layer 51 from passing through the photodiode 21 and spilling over onto an adjacent photodiode 21, charge retention unit 26, or the like.

Consequently, according to the first embodiment, the occurrence of optical noise caused by the spillover of light into the adjacent photodiode 21 or charge retention unit 26 can be reduced.

Also, in the first embodiment, by causing the light shield wall 60b to penetrate from the semiconductor layer 51 to enlarge the light shield region, the incidence of light on the charge retention unit 26 can be reduced further.

Also, in the first embodiment, by applying a negative bias to the light shield wall 60b, pinning is strengthened, and the occurrence of dark current can be reduced. With this arrangement, a lower concentration can be achieved in the p-well layer 23 of the semiconductor layer 51, and therefore the surface charge density Qs of the semiconductor layer 51 as well as the capacitance of the charge retention unit 26 can be increased. Consequently, according to the first embodiment, the pixel characteristics can be improved.

The shaded portion of FIG. 7 illustrates the region where the surface light shield 60a is disposed. As illustrated in FIG. 7, the surface light shield 60a covers a region excluding the light-receiving face of the photodiode 21 on the incident face of the semiconductor layer 51.

In other words, of the incident face of the semiconductor layer 51, the region excluding the region where light is incident on the photodiode 21 is covered by the surface light shield 60a. With this arrangement, in the first embodiment, it is possible to keep light incident on the incident face of the semiconductor layer 51 from being incident on a region other than the light-receiving face of the photodiode 21.

The shaded portion of FIG. 8 illustrates the region where the light shield layer 56 is disposed. As illustrated in FIG. 8, the light shield layer 56 is disposed in a region excluding the active region of the boundary face of the semiconductor layer 51 and the region where the contacts 70a to 70w are disposed.

In other words, the bottom face of the photodiode 21 is covered entirely by the light shield layer 56. Also, the bottom face of the charge retention unit 26 is covered by the light shield layer 56 nearly entirely, except for the active region of the boundary face of the semiconductor layer 51 and the region where the contacts 70a to 70f are disposed.

In this way, by providing the light shield layer 56 on the bottom face of the semiconductor layer 51, it is possible to keep light incident on the incident face of the semiconductor layer 51 from passing through the photodiode 21, reflecting off the wiring film 57a, and spilling over onto an adjacent photodiode 21, charge retention unit 26, or the like.

Consequently, according to the first embodiment, the occurrence of optical noise caused by the spillover of light into the adjacent photodiode 21 or charge retention unit 26 can be reduced.

[Manufacturing Process]

Next, a process of manufacturing the solid-state imaging apparatus 1 according to the first embodiment will be described with reference to drawings such as FIGS. 9A, 9B, 9C, 9D, and 10. FIGS. 9A, 9B, 9C, and 9D are enlarged cross sections schematically illustrating a manufacturing process for a solid-state imaging apparatus 1 according to the first embodiment of the present disclosure.

Figure 9A:
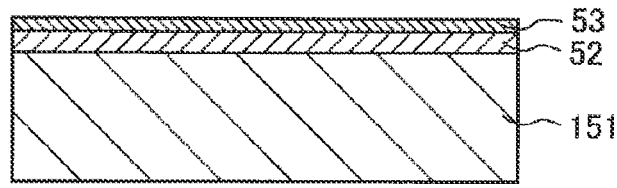
FIG. 9A is an enlarged cross section schematically illustrating a manufacturing process for a solid-state imaging apparatus according to the first embodiment of the present disclosure.

As illustrated in FIG. 9A, the SiO layer 52 of predetermined thickness is deposited by a known method onto the front face of the semiconductor substrate 151 used to form the semiconductor layer 51 (see FIG. 3). Next, the LP-SiN layer 53 of predetermined thickness is deposited by a method such as low pressure CVD onto the SiO layer 52.

Figure 9B:
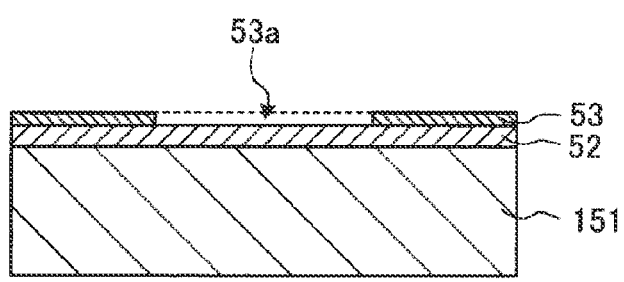
FIG. 9B is an enlarged cross section schematically illustrating a manufacturing process for a solid-state imaging apparatus according to the first embodiment of the present disclosure.

Next, as illustrated in FIG. 9B, in the LP-SiN layer 53, the opening 53a is formed in the region where the trench 51a will be formed later. The opening 53a is formed by forming a hard mask (not illustrated) having a desired aperture on the front face of the LP-SiN layer 53, and selectively dry-etching the LP-SiN layer 53 in the depth direction through the hard mask, for example.

Figure 9C:
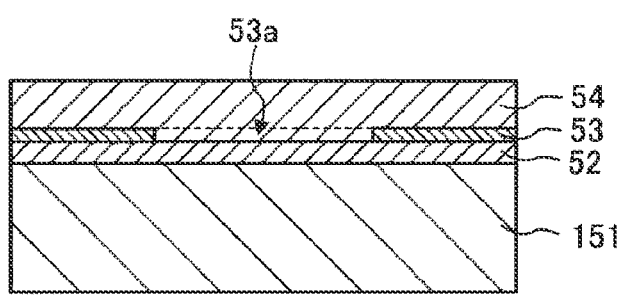
FIG. 9C is an enlarged cross section schematically illustrating a manufacturing process for a solid-state imaging apparatus according to the first embodiment of the present disclosure.

Next, as illustrated in FIG. 9C, the P—SiN layer 54 of predetermined thickness is deposited by a method such as plasma CVD onto the LP-SiN layer 53 to bury the opening 53a.

Figure 9D:
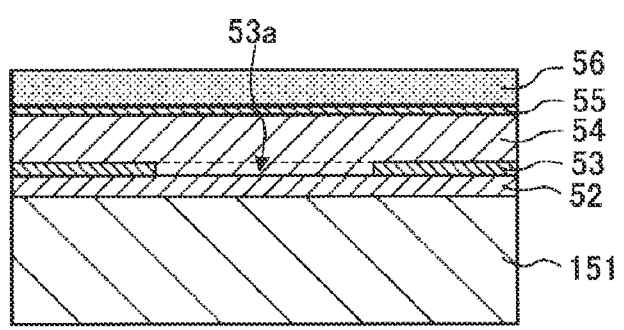
FIG. 9D is an enlarged cross section schematically illustrating a manufacturing process for a solid-state imaging apparatus according to the first embodiment of the present disclosure.

Next, as illustrated in FIG. 9D, the SiO layer 55 of predetermined thickness is deposited by a known method onto the P—SiN layer 54, and the light shield layer 56 of predetermined thickness is deposited by a known method onto the SiO layer 55.

Note that during the manufacturing process described so far, steps of forming components such as the photodiode 21, the charge retention unit 26, and various transistors on the semiconductor substrate 151 by ion implantation, patterning, and the like are performed separately, but such steps are omitted from the description.

Next, although omitted from illustration, the wiring layer (see FIG. 3) is formed on top of the light shield layer 56 by a known method, and a support substrate is applied onto the wiring layer 57. Thereafter, the back face of the semiconductor substrate 151 is ground according to a known method to form the semiconductor layer 51 having a predetermined thickness. Through this process, the state illustrated in FIG. 5A is reached.

Next, as illustrated in FIG. 5B, the trench 51a is formed between the photodiode 21 and the charge retention unit 26. The trench 51a is formed by forming a hard mask (not illustrated) having a desired aperture on the back face of the semiconductor layer 51, and selectively etching the semiconductor layer 51 in the depth direction through the hard mask, for example.

Here, in the first embodiment, it is beneficial to perform the etching process that forms the trench 51a using the multilayer insulating film including the SiO layer 52, the LP-SiN layer 53, the P—SiN layer 54, and the SiO layer 55 as a stopper.

Hypothetically, if the etching process that forms the trench 51a reaches the light shield layer 56 containing a metal film, a metal such as tungsten may be released externally from the exposed light shield layer 56, and the device being formed may become contaminated by the metal in some cases. Furthermore, there is a possibility that the dark characteristics and the like of the device may be degraded by such contamination.

However, in the first embodiment, by using the multilayer insulating film described above as a stopper, the etching process that forms the trench 51a can be kept from reaching the light shield layer 56. Consequently, according to the first embodiment, metal contamination originating from the light shield layer 56 can be suppressed, and therefore the dark characteristics and the like of the device can be maintained favorably.

Next, as illustrated in FIG. 5C, the multilayer film 59 is formed using a method such as ALD on the inner walls of the trench 51a, and thereafter a metal film is embedded inside the trench 51a according to a known method to form the light shield wall 60b.

Additionally, the metal film that covers the light-receiving face of the photodiode 21 on the incident face of the semiconductor layer 51 is etched to form an opening, and components such as the planarizing film 61, the color filter 62, and the microlenses 63 are formed. With this arrangement, the unit pixel 11 of the solid-state imaging apparatus 1 according to the embodiment is completed.

Figure 10:
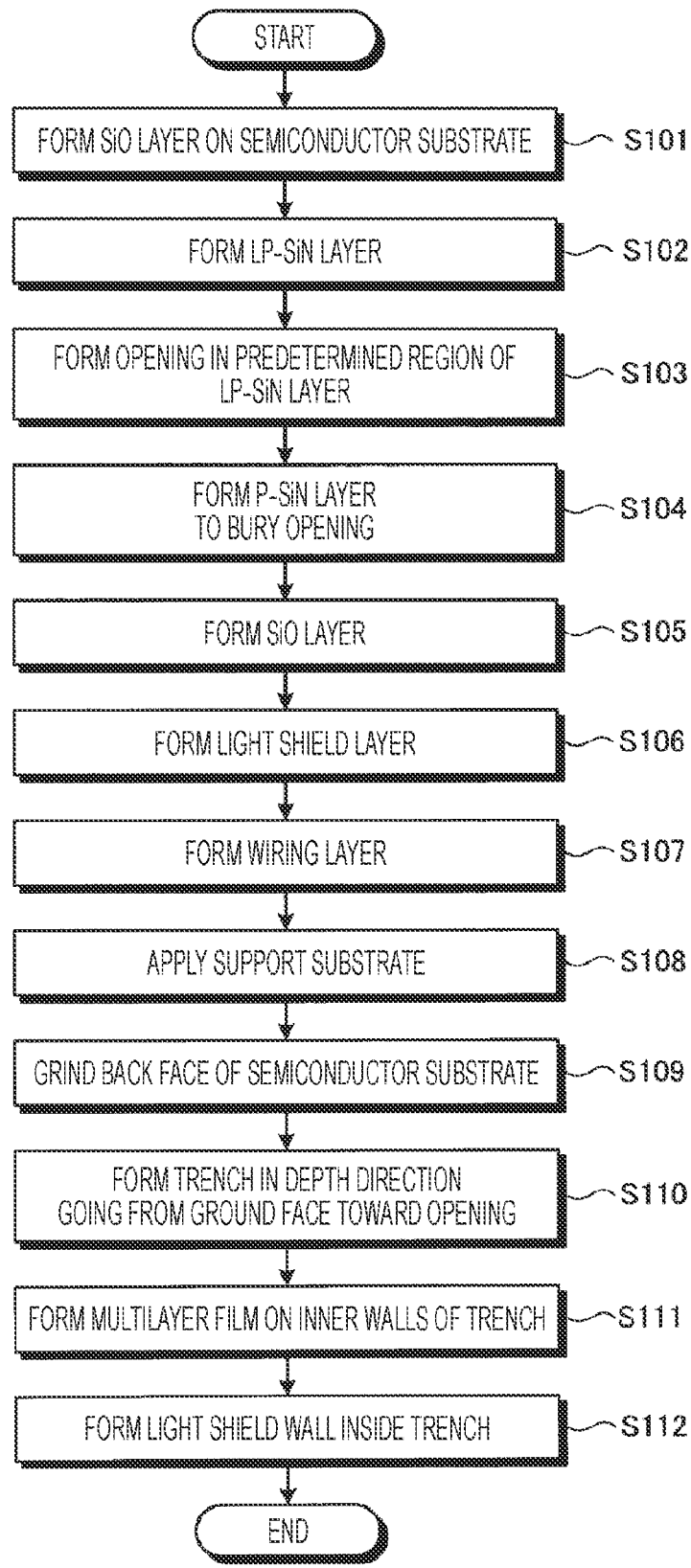
FIG. 10 is a flowchart illustrating steps in a process of manufacturing the solid-state imaging apparatus according to the first embodiment of the present disclosure.

FIG. 10 is a flowchart illustrating steps in a process of manufacturing the solid-state imaging apparatus 1 according to the first embodiment of the present disclosure. As illustrated in FIG. 10, first, the SiO layer 52 is formed on the front face of the semiconductor substrate 151 (step S101). Next, the LP-SiN layer 53 is formed on top of the SiO layer 52 (step S102).

Next, the opening 53a is formed in a predetermined region of the LP-SiN layer 53 (step S103). Thereafter, the P—SiN layer 54 is formed on top of the LP-SiN layer 53 to bury the opening 53a (step S104).

Next, the SiO layer 55 is formed on top of the P—SiN layer (step S105), and the light shield layer 56 is formed on top of the SiO layer 55 (step S106). Thereafter, the wiring layer 57 is formed on top of the light shield layer 56 (step S107), and a support substrate is applied to the wiring layer 57 (step S108).

Next, the back face of the semiconductor substrate 151 is ground (step S109) to form the semiconductor layer 51. Thereafter, the trench 51a is formed in the depth direction going from the ground face toward the opening 53a (step S110).

Next, the multilayer film 59 is formed on the inner walls of the trench 51a (step S111). Thereafter, a metal film is embedded in the trench 51a to form the light shield wall 60b in the trench 51a (step S112), and the process is completed.

[Various Modifications]

Figure 11:
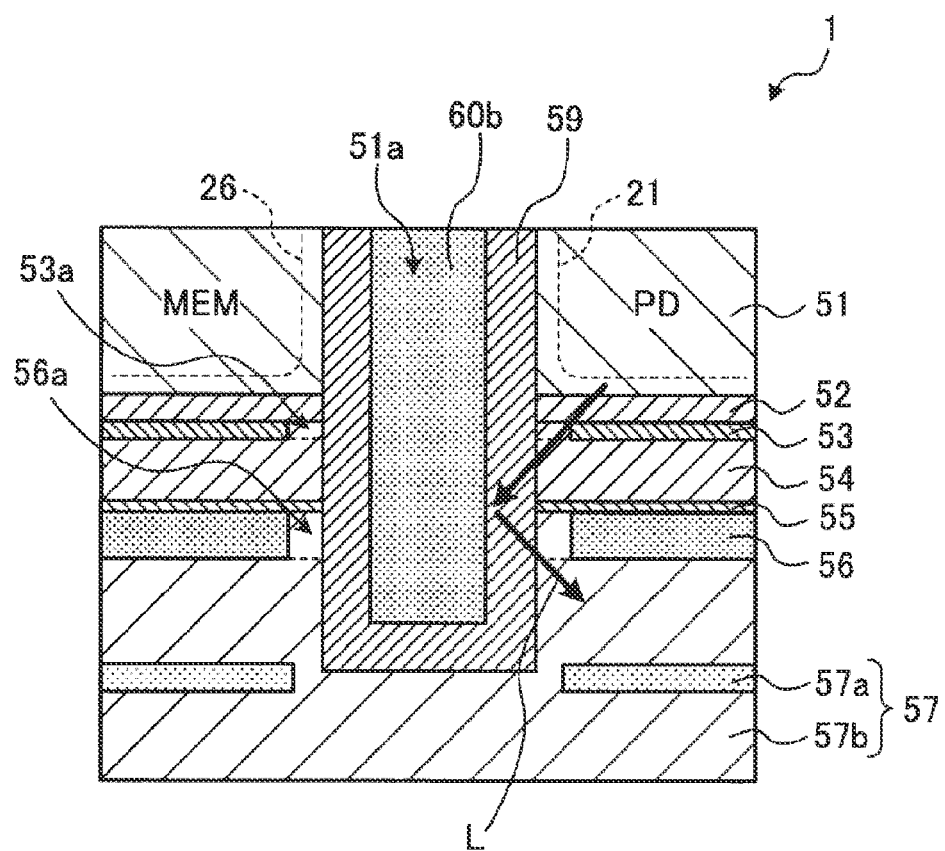
FIG. 11 is an enlarged cross section schematically illustrating a light shield structure of the solid-state imaging apparatus according to Modification 1 of the first embodiment of the present disclosure.

Next, various modification of the first embodiment will be described with reference to FIGS. 11 to 15. FIG. 11 is an enlarged cross section schematically illustrating a light shield structure of the solid-state imaging apparatus 1 according to Modification 1 of the first embodiment of the present disclosure, and is a drawing corresponding to FIG. 5C of the first embodiment.

As illustrated in FIG. 11, in Modification 1, an opening 56a is formed in the light shield layer 56 to surround the trench 51a penetrating the semiconductor layer 51. In other words, the opening 56a is provided in the region where the trench 51a is formed in the light shield layer 56.

Furthermore, in Modification 1, the light shield wall 60b is provided to reach the opening 56a. For example, as illustrated in FIG. 11, the light shield wall 60b is provided to penetrate the opening 56a.

In this way, by providing the light shield wall 60b to penetrate the opening 56a, as illustrated in FIG. 11, light L from inside the photodiode 21 that reaches the region where the trench 51a and the light shield layer 56 are close to each other can be blocked by the light shield wall 60b. With this arrangement, the spillover of light from adjacent unit pixels 11 can be reduced.

Furthermore, in Modification 1, by providing the opening 56a in advance in the region where the trench 51a is to be formed, the light shield layer 56 can be kept from being exposed to the outside during the etching process that forms the trench 51a. Consequently, according to Modification 1, metal contamination originating from the light shield layer 56 can be suppressed, and therefore the dark characteristics and the like of the device can be maintained favorably.

Also, in Modification 1, it is beneficial for the size of the opening 56a to be larger than the area surrounded by the opening 56a in the trench 51a as viewed from the light-incident side. This arrangement makes it possible to further keep the light shield layer 56 from being exposed to the outside during the etching process that forms the trench 51a.

Consequently, according to Modification 1, metal contamination originating from the light shield layer 56 can be suppressed further, and therefore the dark characteristics and the like of the device can be maintained more favorably.

Figure 12:
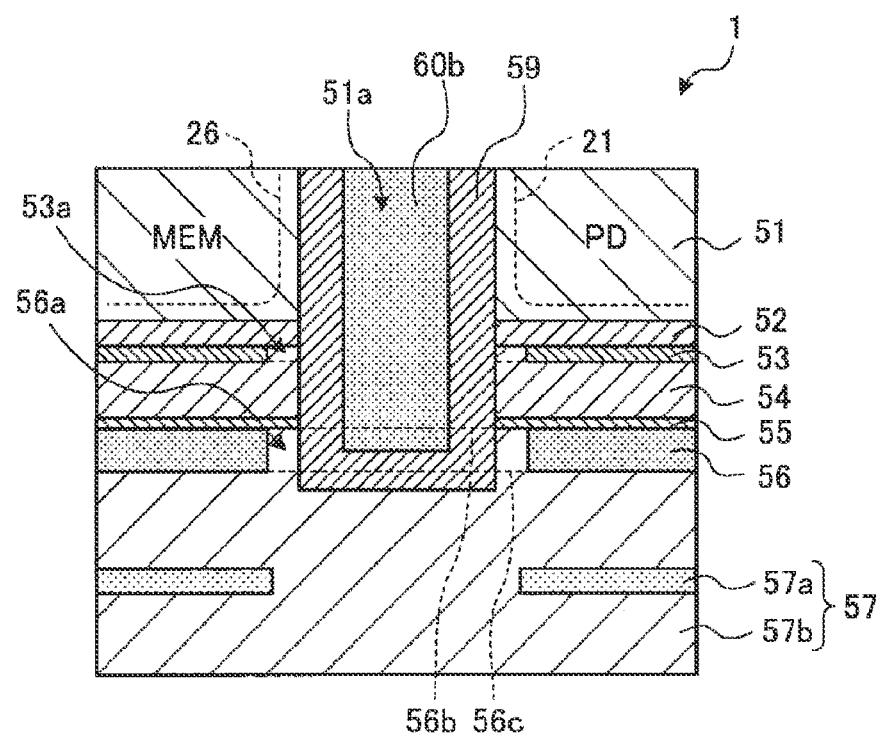
FIG. 12 is an enlarged cross section schematically illustrating a light shield structure of the solid-state imaging apparatus according to Modification 2 of the first embodiment of the present disclosure.

Note that Modification 1 illustrates an example in which the light shield wall 60b is provided to penetrate the opening 56a, but the placement of the light shield wall 60b is not limited to such an example. FIG. 12 is an enlarged cross section schematically illustrating a light shield structure of the solid-state imaging apparatus 1 according to Modification 2 of the first embodiment of the present disclosure.

As illustrated in FIG. 12, the light shield wall 60b may also be provided such that the leading end of the light shield wall 60b is positioned inside the opening 56a. In other words, the leading end of the light shield wall 60b may be disposed between a top face 56b of the light shield layer 56 (the face beside the SiO layer 55) and a bottom face 56c of the light shield layer 56 (the face beside the wiring layer 57).

In this way, by providing the light shield wall 60b such that the leading end is disposed inside the opening 56a, light from inside the photodiode 21 that reaches the region where the trench 51a and the light shield layer 56 are close to each other can be blocked by the light shield wall 60b.

Figure 13:
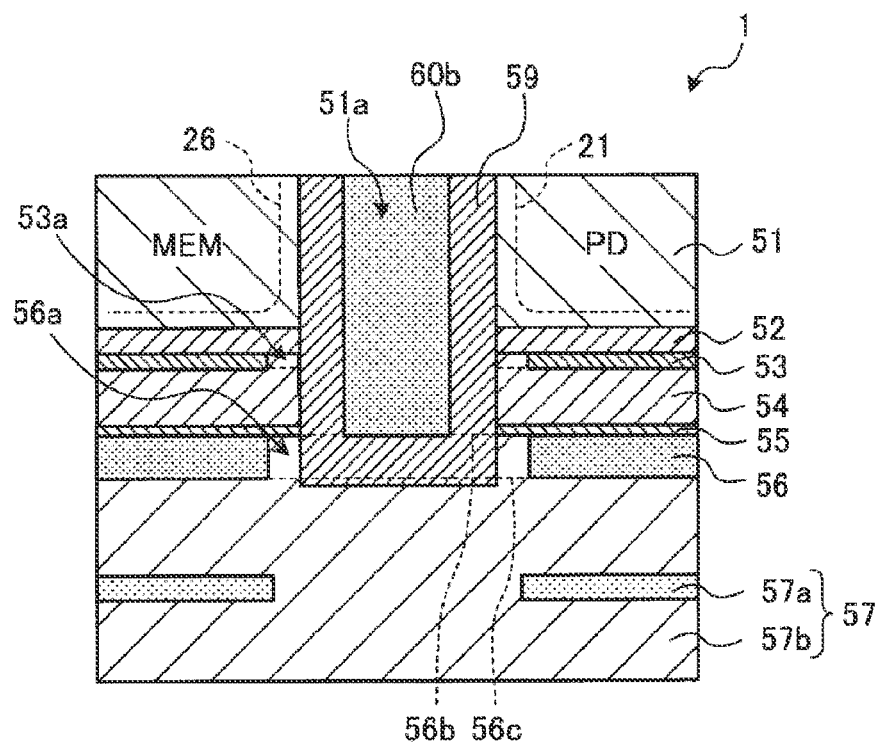
FIG. 13 is an enlarged cross section schematically illustrating a light shield structure of the solid-state imaging apparatus according to Modification 3 of the first embodiment of the present disclosure.

FIG. 13 is an enlarged cross section schematically illustrating a light shield structure of the solid-state imaging apparatus 1 according to Modification 3 of the first embodiment of the present disclosure. As illustrated in FIG. 13, the light shield wall 60b may also be provided such that the leading end of the light shield wall 60b reaches the opening 56a. In other words, the leading end of the light shield wall 60b may also be disposed substantially flush with the top face 56b of the light shield layer 56.

In this way, by providing the light shield wall 60b such that the leading end reaches the opening 56a, light from inside the photodiode 21 that reaches the region where the trench 51a and the light shield layer 56 are close to each other can be blocked by the light shield wall 60b.

Figure 14:
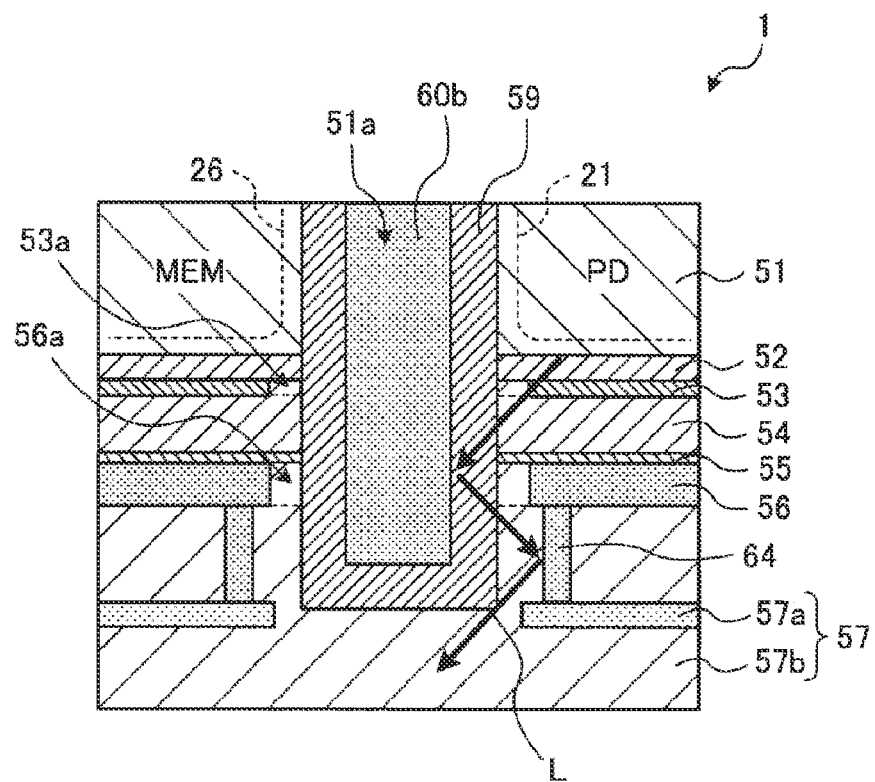
FIG. 14 is an enlarged cross section schematically illustrating a light shield structure of the solid-state imaging apparatus according to Modification 4 of the first embodiment of the present disclosure.

FIG. 14 is an enlarged cross section schematically illustrating a light shield structure of the solid-state imaging apparatus 1 according to Modification 4 of the first embodiment of the present disclosure. As illustrated in FIG. 14, a wall 64 disposed adjacent to the opening 56a to block the area between the light shield layer 56 and the wiring film 57a of the wiring layer 57 may also be provided inside the wiring layer 57.

The wall 64 contains a metal film with light-shielding properties. The material of the wall 64 may be any material that shields light, and for example, a material such as tungsten (W), aluminum (Al), or copper (Cu) can be used.

With this arrangement, as illustrated in FIG. 14, light L reflected by the leading end of the light shield wall 60b can be kept from entering the area between the light shield layer 56 and the wiring film 57a. Consequently, according to Modification 4, light L entering the area between the light shield layer 56 and the wiring film 57a can be kept from spilling over into another unit pixel 11 and producing optical noise.

Figure 15:
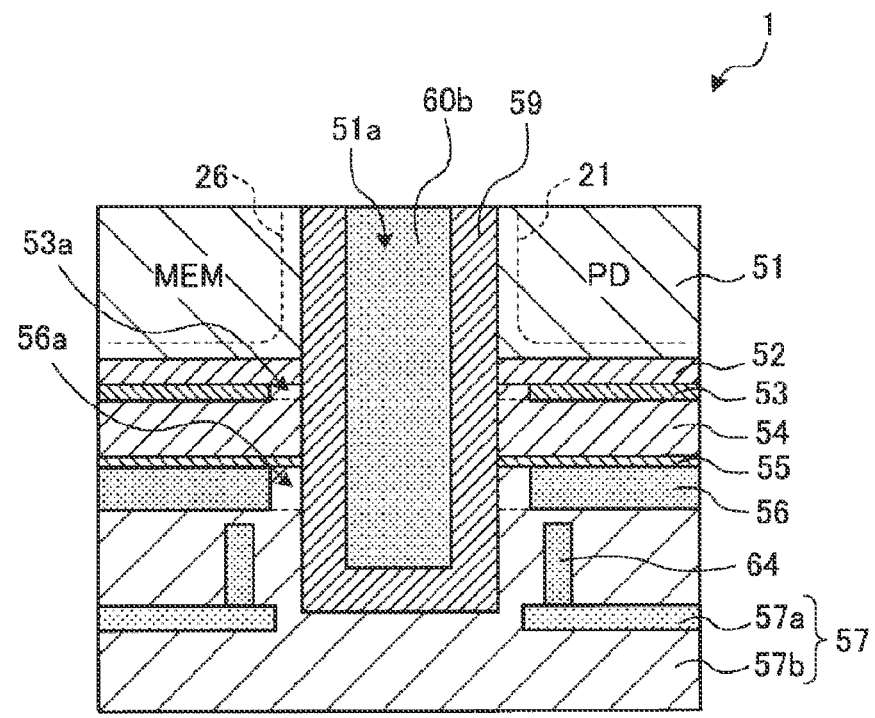
FIG. 15 is an enlarged cross section schematically illustrating a light shield structure of the solid-state imaging apparatus according to Modification 5 of the first embodiment of the present disclosure.

Note that Modification 4 illustrates an example in which the wall 64 is provided in contact with both the light shield layer 56 and the wiring film 57a, but the placement of the wall 64 is not limited to such an example. FIG. 15 is an enlarged cross section schematically illustrating a light shield structure of the solid-state imaging apparatus 1 according to Modification 5 of the first embodiment of the present disclosure.

As illustrated in FIG. 15, the wall 64 may also be disposed in contact with the wiring film 57a only, without abutting the light shield layer 56. With this arrangement, light L reflected by the leading end of the light shield wall 60b likewise can be kept from entering the area between the light shield layer 56 and the wiring film 57a.

Consequently, according to Modification 5, light L entering the area between the light shield layer 56 and the wiring film 57a can be kept from spilling over into another unit pixel 11 and producing optical noise.

[Manufacturing Process of Modification of First Embodiment]

Next, a process of manufacturing the solid-state imaging apparatus 1 according to a modification of the first embodiment will be described with reference to drawings such as FIGS. 16A, 16B, 16C, 16D, 16E, 16F, and 16G. FIGS. 16A, 16B, 16C, 16D, 16E, 16F, and 16G are an enlarged cross section schematically illustrating a manufacturing process of the solid-state imaging apparatus 1 according to Modification 4 of the first embodiment of the present disclosure.

Note that the following describes the manufacturing process for Modification 4, but the manufacturing process described hereinafter can also be suitably applied to the manufacturing processes for other modifications. Also, because the steps of forming the SiO layer 52, the LP-SiN layer 53 with the opening 53a, the P-SiN layer 54, the SiO layer 55, and the light shield layer 56 on the semiconductor substrate 151 are illustrated in FIGS. 9A, 9B, 9C, and 9D, the details of these steps are omitted.

Figure 16A:
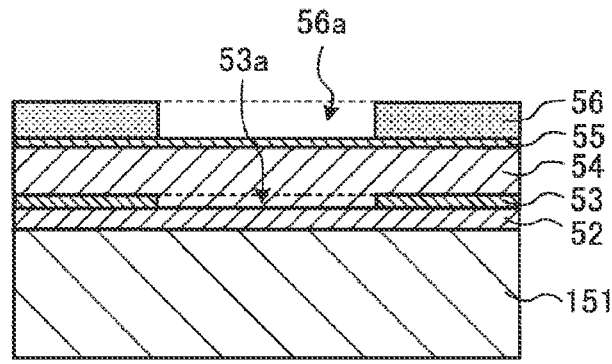
FIG. 16A is an enlarged cross section schematically illustrating a manufacturing process of the solid-state imaging apparatus according to Modification 4 of the first embodiment of the present disclosure.

With respect to the semiconductor substrate 151 provided with the layers up to the light shield layer 56 as illustrated in FIG. 9D, the opening 56a is formed in the light shield layer 56 in the region where the trench 51a is to be formed later, as illustrated in FIG. 16A.

The opening 56a is formed by forming a hard mask (not illustrated) having a desired aperture on the surface of the light shield layer 56, and selectively etching the light shield layer 56 in the depth direction through the hard mask, for example.

Figure 16B:
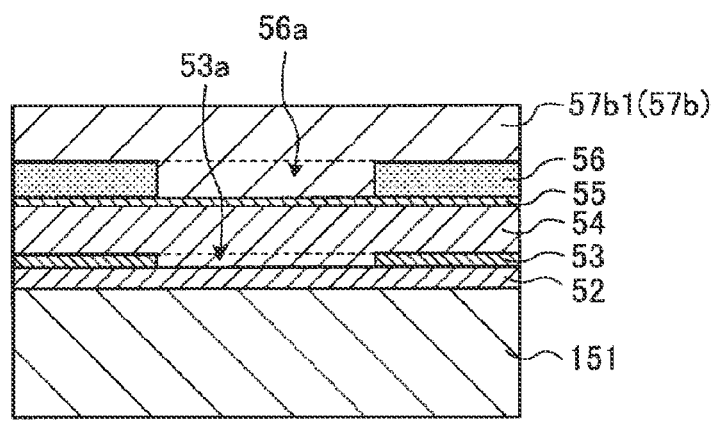
FIG. 16B is an enlarged cross section schematically illustrating a manufacturing process of the solid-state imaging apparatus according to Modification 4 of the first embodiment of the present disclosure.

Next, as illustrated in FIG. 16B, an interlayer insulating film 57b 1 of predetermined thickness is formed according to a known method on top of the light shield layer 56 to bury the opening 56a. Note that the interlayer insulating film 57b 1 is the part of the interlayer insulating film 57b provided between the light shield layer 56 and a wiring film 57a1 (see FIG. 16G) closest to the light shield layer 56.

Figure 16C:
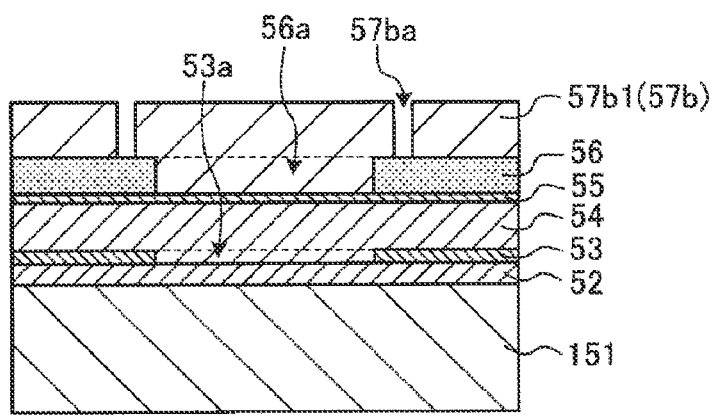
FIG. 16C is an enlarged cross section schematically illustrating a manufacturing process of the solid-state imaging apparatus according to Modification 4 of the first embodiment of the present disclosure.

Next, as illustrated in FIG. 16C, in the interlayer insulating film 57b 1, an opening 57ba is formed in a region where the wall 64 is formed. The opening 57ba is formed by forming a hard mask (not illustrated) having a desired aperture on the surface of the interlayer insulating film 57b1, and selectively etching the interlayer insulating film 57b1 in the depth direction through the hard mask, for example.

Figure 16D:
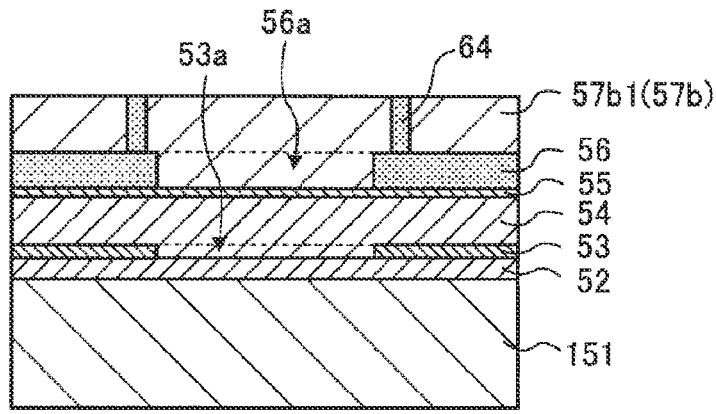
FIG. 16D is an enlarged cross section schematically illustrating a manufacturing process of the solid-state imaging apparatus according to Modification 4 of the first embodiment of the present disclosure.

Next, as illustrated in FIG. 16D, by embedding a metal film in the opening 57ba according to a known method and flattening the surface by a method such as chemical mechanical polishing (CMP), the wall 64 is formed.

Figure 16E:
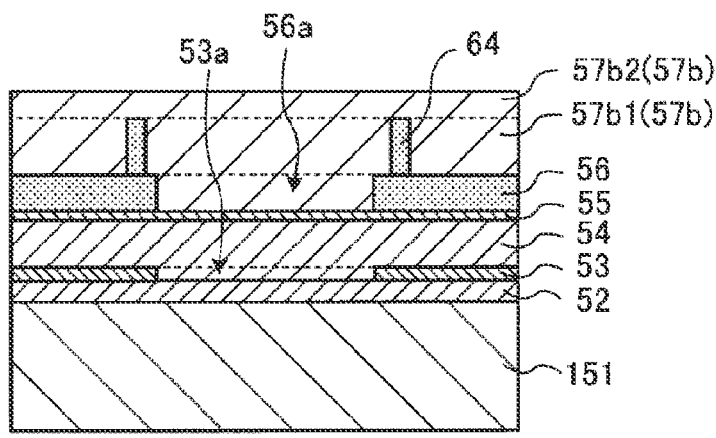
FIG. 16E is an enlarged cross section schematically illustrating a manufacturing process of the solid-state imaging apparatus according to Modification 4 of the first embodiment of the present disclosure.

Next, as illustrated in FIG. 16E, an interlayer insulating film 57b2 of predetermined thickness is formed according to a known method on top of the interlayer insulating film 57b1. Note that the interlayer insulating film 57b2 is the part of the interlayer insulating film 57b provided in the same layer as the wiring film 57a1 closest to the light shield layer 56.

Figure 16F:
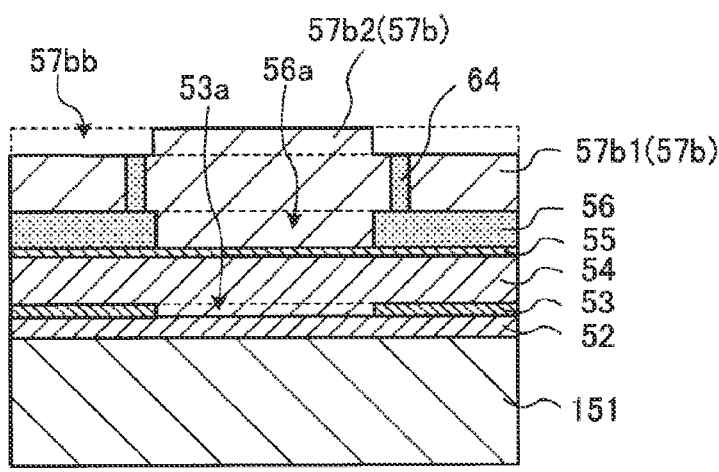
FIG. 16F is an enlarged cross section schematically illustrating a manufacturing process of the solid-state imaging apparatus according to Modification 4 of the first embodiment of the present disclosure.

Next, as illustrated in FIG. 16F, in the interlayer insulating film 57b2, an opening 57bb is formed in a region where the wiring film 57a is formed. The opening 57bb is formed by forming a hard mask (not illustrated) having a desired aperture on the surface of the interlayer insulating film 57b2, and selectively etching the interlayer insulating film 57b2 in the depth direction through the hard mask, for example.

Figure 16G:
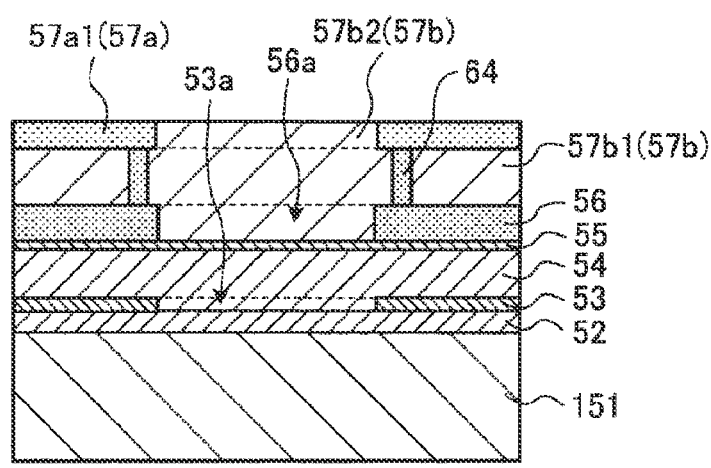
FIG. 16G is an enlarged cross section schematically illustrating a manufacturing process of the solid-state imaging apparatus according to Modification 4 of the first embodiment of the present disclosure.

Next, as illustrated in FIG. 16G, by embedding a metal film in the opening 57bb according to a known method and flattening the surface by a method such as CMP, the wiring film 57a1 is formed. Thereafter, other wiring films 57a and interlayer insulating films 57b are formed by similar methods to form the wiring layer 57.

Here, in Modification 4, by forming the wall 64 to contact at least the wiring film 57a (for example, the wiring film 57a1), the wall 64 can be formed concurrently with the step of forming the normal wiring layer 57.

Consequently, according to Modification 4, adding an extra step for forming the wall 64 is unnecessary, and an increase in manufacturing costs can be suppressed.

Next, although omitted from illustration, a support substrate is applied onto the wiring layer 57 as described above. Thereafter, the back face of the semiconductor substrate 151 is ground to form the semiconductor layer 51 having a predetermined thickness.

Moreover, the trench 51a is formed between the photodiode 21 and the charge retention unit 26. The trench 51a is formed by forming a hard mask (not illustrated) having a desired aperture on the back face of the semiconductor layer 51, and selectively etching the semiconductor layer 51 in the depth direction through the hard mask, for example.

In addition, by forming the multilayer film 59 using a method such as ALD on the inner walls of the trench 51a and burying a metal film inside the trench 51a to form the light shield wall 60b, the light shield structure of Modification 4 illustrated in FIG. 14 can be achieved.

Note that in Modifications 1 to 5, it is beneficial to provide the opening 53a in advance in the region where the trench 51a is to be formed in the LP-SiN layer 53, similarly to the embodiment. This arrangement makes it possible to keep the trench 51a from deforming from the desired shape due to the LP-SiN layer 53 remaining inside the trench 51a when forming the trench 51a to reach the light shield layer 56.

Consequently, according to Modifications 1 to 5, by providing the opening 53a in the LP-SiN layer 53, the light shield wall 60b can be kept from deforming from the desired shape.

Note that Modifications 1 to 5 illustrate an example in which the opening 56a is provided in the light shield layer 56 and the opening 53a is provided in the LP-SiN layer 53, but the opening 53a does not necessarily have to be provided in the LP-SiN layer 53.

Second Embodiment

[Light Shield Structure]

Figure 17:
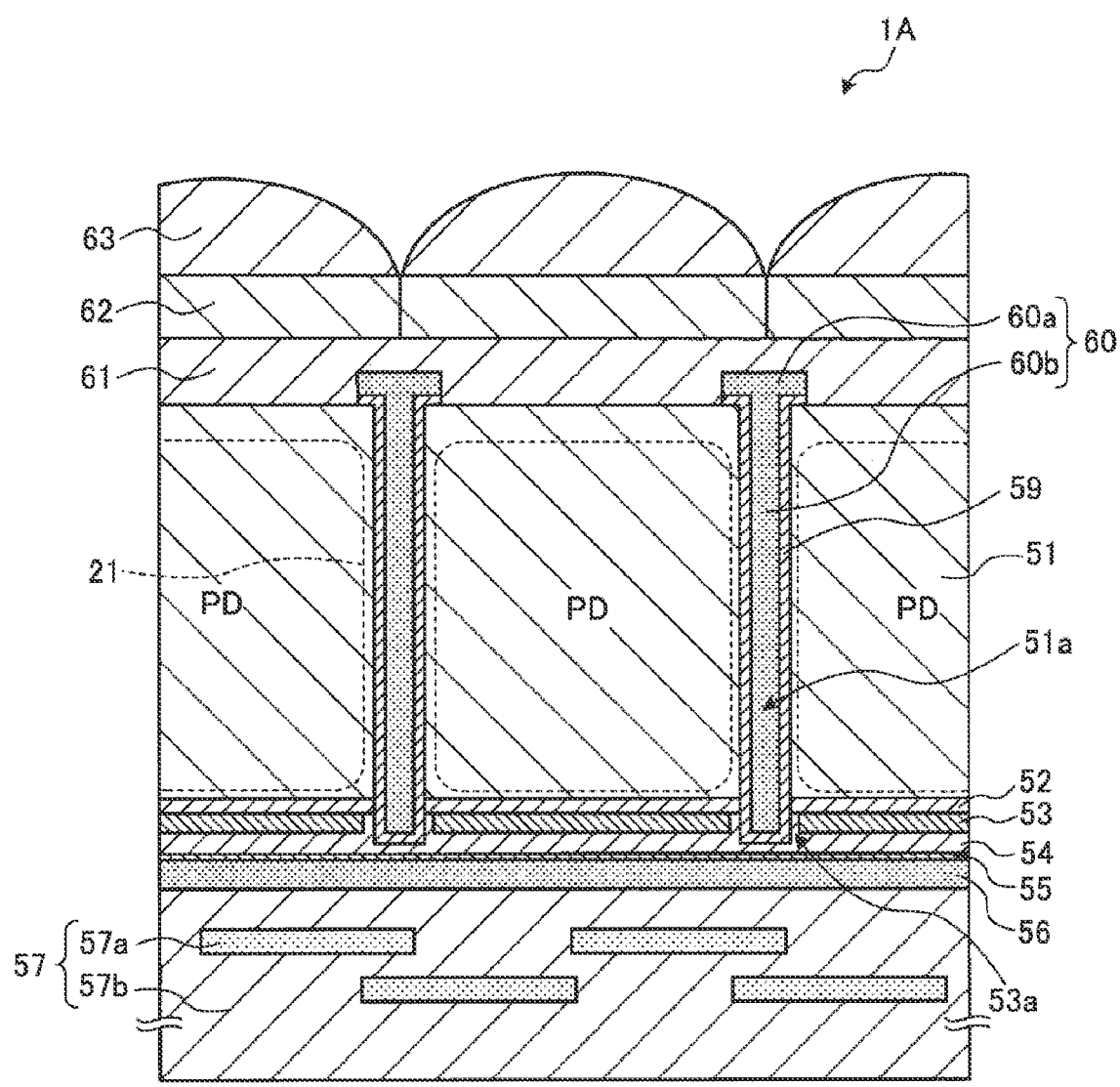
FIG. 17 is a cross section schematically illustrating a light shield structure of the solid-state imaging apparatus according to the second embodiment of the present disclosure.

Next, a light shield structure of the solid-state imaging apparatus 1 in the second embodiment will be described with reference to FIGS. 17 and 18. FIG. 17 is a cross section schematically illustrating a light shield structure of the solid-state imaging apparatus 1A according to the second embodiment of the present disclosure.

As illustrated in FIG. 17, unlike the first embodiment, the solid-state imaging apparatus 1A according to the second embodiment is a back-illuminated CMOS image sensor not provided with the charge retention unit 26. Consequently, the semiconductor layer 51 of the solid-state imaging apparatus 1A includes a plurality of photodiodes 21, and a single photodiode 21 is provided with respect to a single unit pixel 11 (see FIG. 1) of the solid-state imaging apparatus 1A.

Also, the trench 51a is formed between adjacent photodiodes 21. Like the first embodiment, the trench 51a is formed to penetrate the semiconductor layer 51 from the incident face of the semiconductor layer 51.

Additionally, the multilayer film 59 and the light shield 60 are provided on the incident face of the semiconductor layer 51 and in the trench 51a. The multilayer film 59 is formed on the incident face of the semiconductor layer 51 and on the inner walls of the trench 51a.

The light shield 60 reduces the direct or indirect spillover of light incident from the incident face of the semiconductor layer 51 into an adjacent photodiode 21. The light shield 60 includes the surface light shield 60a and the light shield wall 60b.

The surface light shield 60a covers a region excluding the area above the light-receiving face of the photodiode 21 on the incident face of the semiconductor layer 51. In other words, the surface light shield 60a covers a region of the light-receiving face of the semiconductor layer 51 excluding the region where light is incident to the photodiode 21.

The light shield wall 60b penetrates the semiconductor layer 51 from the incident face of the semiconductor layer 51, and extends down to the bottom face of the semiconductor layer 51. The light shield wall 60b is disposed between photodiodes 21 that are adjacent to each other, for example.

Here, in the second embodiment, an opening 53a is provided in the LP-SiN layer 53 to surround the trench 51a penetrating through the semiconductor layer 51, similarly to the first embodiment. In other words, the opening 53a is provided in the region where the trench 51a is formed in the LP-SiN layer 53.

With this arrangement, since the LP-SiN layer 53 is not provided in the region where the trench 51a is to be formed, a situation in which the LP-SiN layer 53 is not etched and remains inside the trench 51a can be avoided.

Figure 18:
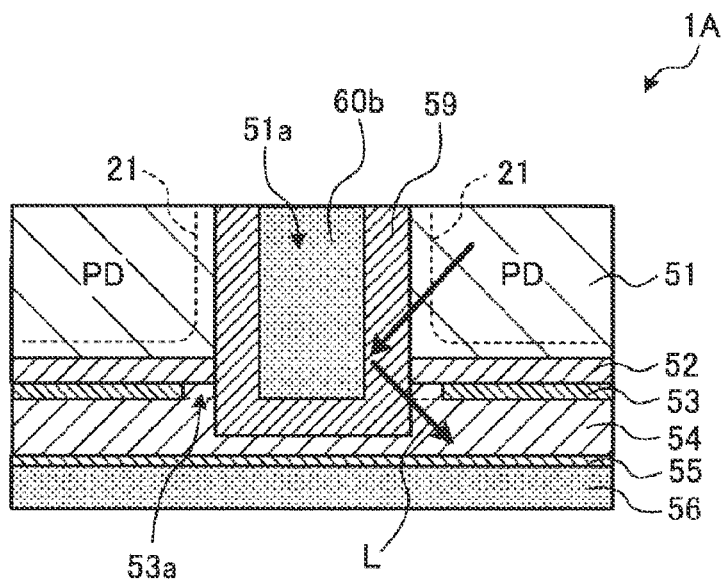
FIG. 18 is an enlarged cross section schematically illustrating a light shield structure of the solid-state imaging apparatus according to the second embodiment of the present disclosure.

Consequently, in the second embodiment, like the first embodiment, the inner walls of the trench 51a are covered substantially uniformly by the multilayer film 59, and therefore the shape of the leading end of the light shield wall 60b is a rectangular shape similar to the shape of the trench 51a, as illustrated in FIG. 18. FIG. 18 is an enlarged cross section schematically illustrating a light shield structure of the solid-state imaging apparatus 1A according to the second embodiment of the present disclosure.

With this arrangement, light L from inside the photodiode 21 that reaches the region where the trench 51a and the light shield layer 56 are close to each other can be blocked by the light shield wall 60b. Consequently, according to the second embodiment, the spillover of light from the adjacent unit pixel 11 can be reduced.

Also, in the second embodiment, it is beneficial for the size of the opening 53a to be larger than the area surrounded by the opening 53a in the trench 51a as viewed from the light-incident side. This arrangement makes it possible to further avoid having the LP-SiN layer 53 remain projecting into the trench 51a when forming the trench 51a.

Consequently, according to the second embodiment, the spillover of light from the adjacent unit pixel 11 can be reduced further.

Also, in the second embodiment, it is beneficial for the LP-SiN layer 53 given as one example of an insulation layer to contain a silicon nitride film deposited by low pressure CVD. With this arrangement, reliable transistors can be formed inside the solid-state imaging apparatus 1A.

Note that although the second embodiment illustrates an example in which the LP-SiN layer 53 contains a silicon nitride film deposited by low pressure CVD, the material of the LP-SiN layer 53 is not limited to such an example. In the second embodiment, the material of the LP-SiN layer 53 may also be a material different from a silicon nitride film deposited by low pressure CVD insofar as the material has a high film density compared to the surrounding SiO layer 52, P—SiN layer 54, and SiO layer 55.

Furthermore, in the second embodiment, it is beneficial to perform the etching process that forms the trench 51a using the multilayer insulating film including the SiO layer 52, the LP-SiN layer 53, the P—SiN layer 54, and the SiO layer 55 as a stopper.

Therefore, similarly to the first embodiment, metal contamination originating from the light shield layer 56 can be suppressed, and therefore the dark characteristics and the like of the device can be maintained favorably.

[Various Modifications]

Figure 19:
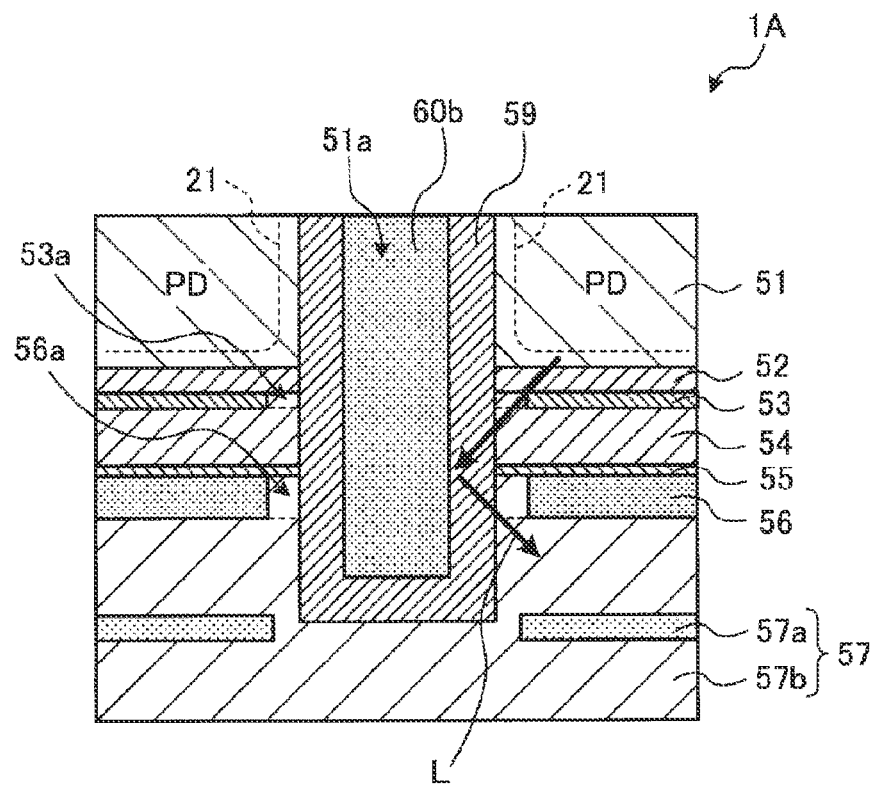
FIG. 19 is an enlarged cross section schematically illustrating a light shield structure of the solid-state imaging apparatus according to Modification 6 of the second embodiment of the present disclosure.

Next, various modification of the second embodiment will be described with reference to FIGS. 19 and 20. FIG. 19 is an enlarged cross section schematically illustrating a light shield structure of the solid-state imaging apparatus 1A according to Modification 6 of the second embodiment of the present disclosure.

In Modification 6, similarly to the Modification 1 of the first embodiment, an opening 56a is formed in the light shield layer 56 to surround the trench 51a penetrating the semiconductor layer 51. In other words, the opening 56a is provided in the region where the trench 51a is formed in the light shield layer 56.

Furthermore, in Modification 6, the light shield wall 60b is provided to reach the opening 56a. For example, as illustrated in FIG. 19, the light shield wall 60b is provided to penetrate the opening 56a.

In this way, by providing the light shield wall 60b to penetrate the opening 56a, as illustrated in FIG. 19, light L from inside the photodiode 21 that reaches the region where the trench 51a and the light shield layer 56 are close to each other can be blocked by the light shield wall 60b. Consequently, the spillover of light from adjacent unit pixels 11 can be reduced.

Furthermore, in Modification 6, by providing the opening 56a in advance in the region where the trench 51a is to be formed, the light shield layer 56 can be kept from being exposed to the outside during the etching process that forms the trench 51a. Consequently, according to Modification 6, metal contamination originating from the light shield layer 56 can be suppressed, and therefore the dark characteristics and the like of the device can be maintained favorably.

Note that Modification 6 illustrates an example in which the light shield wall 60b is provided to penetrate the opening 56a, but the placement of the light shield wall 60b is not limited to such an example, and it is enough to provide the light shield wall 60b to reach the opening 56a. With this arrangement as well, the spillover of light from adjacent unit pixels 11 can be reduced.

Figure 20:
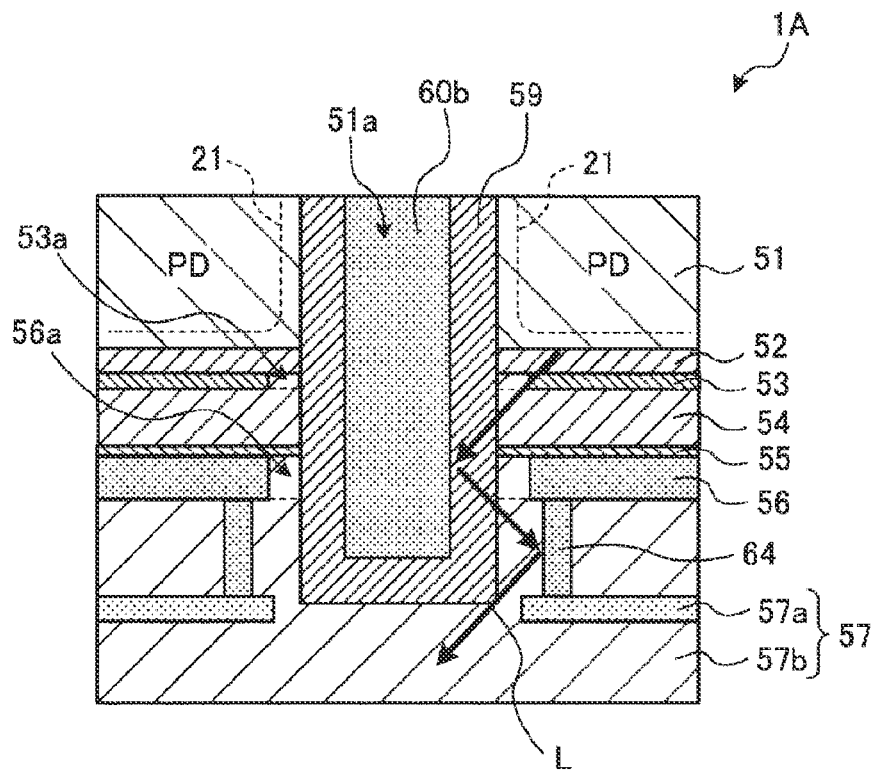
FIG. 20 is an enlarged cross section schematically illustrating a light shield structure of the solid-state imaging apparatus according to Modification 7 of the second embodiment of the present disclosure.

FIG. 20 is an enlarged cross section schematically illustrating a light shield structure of the solid-state imaging apparatus 1A according to Modification 7 of the second embodiment of the present disclosure.

In Modification 7, similarly to the Modification 4 of the first embodiment, a wall 64 disposed adjacent to the opening 56a to block the area between the light shield layer 56 and the wiring film 57a of the wiring layer 57 is provided inside the wiring layer 57.

With this arrangement, as illustrated in FIG. 20, light L reflected by the leading end of the light shield wall 60b can be kept from entering the area between the light shield layer 56 and the wiring film 57a. Consequently, according to Modification 7, light L entering the area between the light shield layer 56 and the wiring film 57a can be kept from spilling over into another unit pixel 11 and producing optical noise.

Note that Modification 7 illustrates an example in which the wall 64 is provided in contact with both the light shield layer 56 and the wiring film 57a, but the wall 64 may also be disposed in contact with the wiring film 57a only, without abutting the light shield layer 56. With this arrangement, light L reflected by the leading end of the light shield wall 60b likewise can be kept from entering the area between the light shield layer 56 and the wiring film 57a.

(Electronic Device)

Note that the present disclosure is not limited in application to a solid-state imaging apparatus. Namely, the present disclosure is applicable to electronic devices in general that include a solid-state imaging apparatus, such as a camera module or an imaging apparatus other than a solid-state imaging apparatus, a mobile terminal apparatus having an imaging function, or a copier that uses a solid-state imaging apparatus in an image reading unit.

Examples of an imaging apparatus include a digital still camera and a video camera. Also, examples of a mobile terminal apparatus having an imaging function include a smartphone and a tablet-type terminal, for example.

Figure 21:
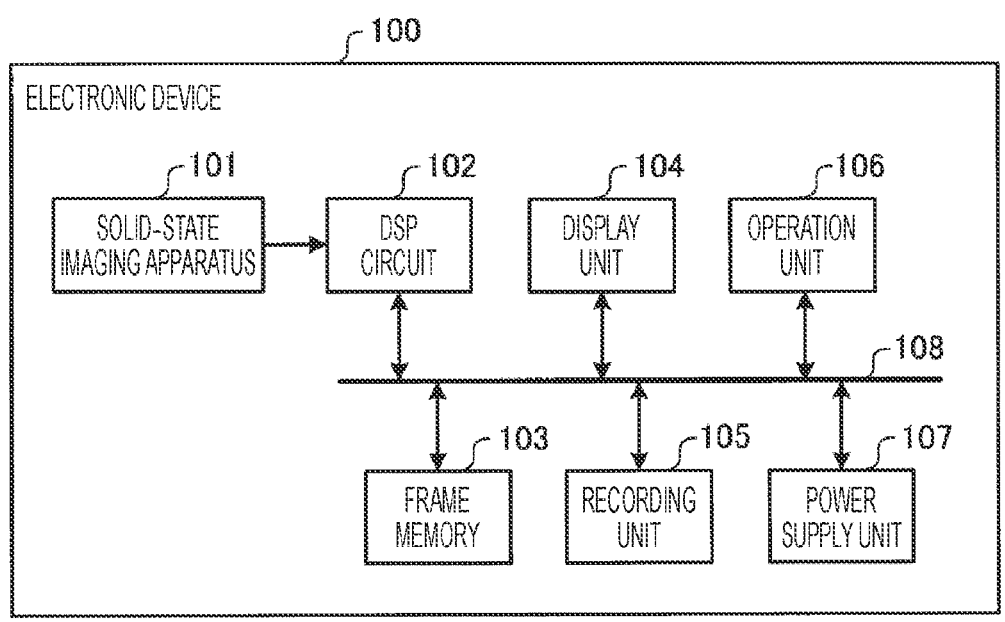
FIG. 21 is a block diagram illustrating a configuration example of an electronic device according to the embodiments of the present disclosure.

FIG. 21 is a block diagram illustrating a configuration example of an electronic device 100 according to the embodiments of the present disclosure. The electronic device 100 of FIG. 21 is an electronic device, such as an imaging apparatus like a digital still camera or a video camera, or a mobile terminal apparatus like a smartphone or a tablet-type terminal, for example.

In FIG. 21, the electronic device 100 includes a solid-state imaging apparatus 101, a DSP circuit 102, frame memory 103, a display unit 104, a recording unit 105, an operation unit 106, and a power supply unit 107. Also, in the electronic device 100, the DSP circuit 102, the frame memory 103, the display unit 104, the recording unit 105, the operation unit 106, and the power supply unit 107 are interconnected through a bus line 108.

The solid-state imaging apparatus 101 captures incident light (image light) from a subject through an optical lens system (not illustrated), converts the light intensity of the incident light formed into an image on an imaging surface into electrical signals in units of pixels, and outputs the electrical signals as pixel signals. Additionally, the solid-state imaging apparatus 101 corresponds to the solid-state imaging apparatus 1 according to the first embodiment and the solid-state imaging apparatus 1A according to the second embodiment described above.

The DSP circuit 102 is a camera signal processing circuit that processes signals supplied from the solid-state imaging apparatus 101. The frame memory 103 temporarily holds image data processed by the DSP circuit 102 in units of frames.

The display unit 104 includes a panel-type display device such as a liquid crystal panel or an organic electroluminescence (EL) panel, for example, and displays moving images or still images captured by the solid-state imaging apparatus 101. The recording unit 105 records the image data of moving images or still images captured by the solid-state imaging apparatus 101 to a recording medium such as semiconductor memory or a hard disk.

The operation unit 106 issues operating commands related to various functions included in the electronic device 100 according to operations performed by a user. The power supply unit 107 appropriately supplies power from various power sources that act as the sources of operating power for the DSP circuit 102, the frame memory 103, the display unit 104, the recording unit 105, and the operation unit 106 to these supply destinations.

In the electronic device 100 configured in this way, by applying the solid-state imaging apparatus 1 or 1A of the embodiments described above as the solid-state imaging apparatus 101, the spillover of light from adjacent unit pixels 11 can be reduced.

Note that the effects described in this specification are merely for the sake of example and non-limiting, and there may be other additional effects.

Additionally, the present technology may also be configured as below.

(1)

A solid-state imaging apparatus including:
  a semiconductor layer provided with a plurality of photoelectric conversion units and a plurality of charge retention units that retain charge generated by the photoelectric conversion units;
  a light shield wall provided inside a trench formed in a depth direction from a light-incident side between the photoelectric conversion units and the charge retention units adjacent to each other in the semiconductor layer; and
  an insulation layer provided on a side of the semiconductor layer opposite from the light-incident side, and having an opening that surrounds the trench.

(2)

The solid-state imaging apparatus according to (1), in which
  a size of the opening in the insulation layer is larger than an area of the trench surrounded by the opening as viewed from the light-incident side.

(3)
The solid-state imaging apparatus according to (1) or (2), in which
the insulation layer
contains a low pressure (LP)-SiN film.

(4)
The solid-state imaging apparatus according to any one of (1) to (3), further including:
a light shield layer provided on a side of the insulation layer opposite from the semiconductor layer.

(5)
The solid-state imaging apparatus according to (4), in which
the light shield layer
has an opening that surrounds the trench.

(6)
The solid-state imaging apparatus according to (5), in which
a size of the opening in the light shield layer is larger than an area of the trench surrounded by the opening as viewed from the light-incident side.

(7)
The solid-state imaging apparatus according to (5) or (6), in which
the light shield wall
reaches the opening in the light shield layer.

(8)
The solid-state imaging apparatus according to any one of (5) to (7), further including:
a wiring film provided on a side of the light shield layer opposite from the insulation layer; and
a wall provided adjacent to the opening in the light shield layer to block an area between the light shield layer and the wiring film.

(9)
A solid-state imaging apparatus including:
a semiconductor layer provided with a plurality of photoelectric conversion units;
a light shield wall provided inside a trench formed in a depth direction from a light-incident side between the photoelectric conversion units adjacent to each other in the semiconductor layer; and
an insulation layer provided on a side of the semiconductor layer opposite from the light-incident side, and having an opening that surrounds the trench.

(10)
The solid-state imaging apparatus according to (9), in which
a size of the opening in the insulation layer is larger than an area of the trench surrounded by the opening as viewed from the light-incident side.

(11)
The solid-state imaging apparatus according to (9) or (10), in which
the insulation layer
contains a low pressure (LP)-SiN film.

(12)
The solid-state imaging apparatus according to any one of (9) to (11), further including:
a light shield layer provided on a side of the insulation layer opposite from the semiconductor layer.

(13)
The solid-state imaging apparatus according to (12), in which
the light shield layer
has an opening that surrounds the trench.

(14)
The solid-state imaging apparatus according to (13), in which
a size of the opening in the light shield layer is larger than an area of the trench surrounded by the opening as viewed from the light-incident side.

(15)
The solid-state imaging apparatus according to (13) or (14), in which
the light shield wall
reaches the opening in the light shield layer.

(16)
The solid-state imaging apparatus according to any one of (13) to (15), further including:
a wiring film provided on a side of the light shield layer opposite from the insulation layer; and
a wall provided adjacent to the opening in the light shield layer to block an area between the light shield layer and the wiring film.

(17)
A method of manufacturing a solid-state imaging apparatus, the method including:
forming an insulation layer in a semiconductor substrate;
forming an opening in a predetermined region of the insulation layer;
forming another insulation layer to bury the opening;
grinding a face on a side of the semiconductor substrate opposite from a side on which the insulation layer is formed;
forming a trench in a depth direction going from the ground face of the semiconductor substrate toward the opening; and
forming a light shield wall inside the trench.

(18)
The method of manufacturing a solid-state imaging apparatus according to (17), in which
the forming of the trench
uses a multilayer insulating film including the insulation layer and the another insulation layer as a stopper.

(19)
The method of manufacturing a solid-state imaging apparatus according to (17) or (18), further including:
forming a light shield layer after forming the another insulation layer; and
forming an opening in a predetermined region of the light shield layer.

(20)
An electronic device
provided with a solid-state imaging apparatus including:
a semiconductor layer provided with a plurality of photoelectric conversion units and a plurality of charge retention units that retain charge generated by the photoelectric conversion units;
a light shield wall provided inside a trench formed in a depth direction from a light-incident side between the photoelectric conversion units and the charge retention units adjacent to each other in the semiconductor layer; and
an insulation layer provided on a side of the semiconductor layer opposite from the light-incident side, and having an opening that surrounds the trench.

(21)
An electronic device
provided with a solid-state imaging apparatus including:
a semiconductor layer provided with a plurality of photoelectric conversion units;
a light shield wall provided inside a trench formed in a depth direction from a light-incident side between the photoelectric conversion units adjacent to each other in the semiconductor layer; and an insulation layer provided on a side of the semiconductor layer opposite from the light-incident side, and having an opening that surrounds the trench.

REFERENCE SIGNS LIST 1, 1A Solid-state imaging apparatus
10 Pixel array unit
11 Unit pixel
21 Photodiode (an example of photoelectric conversion unit)
26 Charge retention unit
Semiconductor layer
51a, 51b Trench
52, 55 SiO layer
LP-SiN layer (an example of insulation layer)
53a Opening
P—SiN layer (an example of another insulation layer)
Light shield layer
56a Opening
57 Wiring layer
57a, 57a1 Wiring film
57b, 57b1, 57b2 Interlayer insulating film
60 Light shield
60b Light shield wall
Wall
100 Electronic device

The invention claimed is:

1. A solid-state imaging apparatus, comprising:
a semiconductor layer that includes:
a plurality of photoelectric conversion units configured to generate charge; and
a plurality of charge retention units configured to retain the charge generated by the plurality of photoelectric conversion units;
a trench in the semiconductor layer, wherein
the trench extends in a depth direction from a light-incident side of the semiconductor layer,
the trench is between a photoelectric conversion unit of the plurality of photoelectric conversion units and a charge retention unit of the plurality of charge retention units, and
the photoelectric conversion unit is adjacent to the charge retention unit;
a light shield wall inside the trench; and
an insulation layer provided on a side of the semiconductor layer opposite to the light-incident side, wherein
the insulation layer includes a first opening that surrounds the trench, and
a size of the first opening in the insulation layer is larger than a first area of the trench surrounded by the first opening as viewed from the light-incident side.

2. The solid-state imaging apparatus according to claim 1, wherein the insulation layer further includes a low pressure (LP)-SiN film.

3. The solid-state imaging apparatus according to claim 1, further comprising a light shield layer on a side of the insulation layer opposite to the semiconductor layer.

4. The solid-state imaging apparatus according to claim 3, wherein the light shield layer includes a second opening that surrounds the trench.

5. The solid-state imaging apparatus according to claim 4, wherein a size of the second opening in the light shield layer is larger than a second area of the trench surrounded by the second opening as viewed from the light-incident side.

6. The solid-state imaging apparatus according to claim 4, wherein the light shield wall is in the second opening in the light shield layer.

7. The solid-state imaging apparatus according to claim 4, further comprising:
a wiring film on a side of the light shield layer opposite to the insulation layer; and
a wall adjacent to the second opening in the light shield layer, wherein the wall blocks an area between the light shield layer and the wiring film.

8. A solid-state imaging apparatus, comprising:
a semiconductor layer that includes a plurality of photoelectric conversion units;
a trench in the semiconductor layer, wherein the trench extends in a depth direction from a light-incident side of the semiconductor layer,
the trench is between a first photoelectric conversion unit of the plurality of photoelectric conversion units and a second photoelectric conversion unit of the plurality of photoelectric conversion units, and
the first photoelectric conversion unit is adjacent to the second photoelectric conversion unit;
a light shield wall inside the trench; and
an insulation layer on a side of the semiconductor layer opposite to the light-incident side, wherein
the insulation layer includes an opening that surrounds the trench, and
a size of the opening in the insulation layer is larger than an area of the trench surrounded by the opening as viewed from the light-incident side.

9. A method of manufacturing a solid-state imaging apparatus, the method comprising:
forming a first insulation layer in a semiconductor substrate;
forming a first opening in a specific region of the first insulation layer;
forming a second insulation layer to bury the first opening;
grinding a face of the semiconductor substrate, wherein the face is on a side of the semiconductor substrate opposite to a side on which the first insulation layer is formed;
forming a trench in a depth direction going from the ground face of the semiconductor substrate toward the first opening; and
forming a light shield wall inside the trench.

10. The method of manufacturing the solid-state imaging apparatus according to claim 9, wherein the forming of the trench uses a multilayer insulating film including the first insulation layer and the second insulation layer as a stopper.

11. The method of manufacturing the solid-state imaging apparatus according to claim 9, further comprising:
forming a light shield layer after forming the second insulation layer; and
forming a second opening in a specific region of the light shield layer.

12. An electronic device, comprising:
a solid-state imaging apparatus that includes:
a semiconductor layer that includes:
a plurality of photoelectric conversion units configured to generate charge; and
a plurality of charge retention units configured to retain the charge generated by the plurality of photoelectric conversion units;
a trench in the semiconductor layer, wherein
the trench extends in a depth direction from a light-incident side of the semiconductor layer, the trench is between a photoelectric conversion unit of the plurality of photoelectric conversion units and a charge retention unit of the plurality of charge retention units, and
the photoelectric conversion unit is adjacent to the charge retention unit;
a light shield wall inside the trench; and
an insulation layer on a side of the semiconductor layer opposite to the light-incident side, wherein
the insulation layer includes an opening that surrounds the trench, and
a size of the opening in the insulation layer is larger than an area of the trench surrounded by the opening as viewed from the light-incident side.

13. An electronic device, comprising:
a solid-state imaging apparatus that includes:
a semiconductor layer that includes a plurality of photoelectric conversion units;
a trench in the semiconductor layer, wherein
the trench extends in a depth direction from a light-incident side of the semiconductor layer,
the trench is between a first photoelectric conversion unit of the plurality of photoelectric conversion units and a second photoelectric conversion unit of the plurality of photoelectric conversion units, and
the first photoelectric conversion unit is adjacent to the second photoelectric conversion unit;
a light shield wall inside the trench; and
an insulation layer on a side of the semiconductor layer opposite to the light-incident side, wherein
the insulation layer includes an opening that surrounds the trench, and
a size of the opening in the insulation layer is larger than an area of the trench surrounded by the opening as viewed from the light-incident side.

* * * * *